(12) United States Patent
Bang

(10) Patent No.: US 11,593,242 B2
(45) Date of Patent: Feb. 28, 2023

(54) METHOD OF OPERATING STORAGE DEVICE FOR IMPROVING RELIABILITY, STORAGE DEVICE PERFORMING THE SAME AND METHOD OF OPERATING STORAGE USING THE SAME

(71) Applicant: SAMSUNG ELECTRONICS CO., LTD., Suwon-si (KR)

(72) Inventor: Kwangkyu Bang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 166 days.

(21) Appl. No.: 16/863,531

(22) Filed: Apr. 30, 2020

(65) Prior Publication Data

US 2021/0049086 A1    Feb. 18, 2021

(30) Foreign Application Priority Data

Aug. 13, 2019   (KR) ................. 10-2019-0098846

(51) Int. Cl.
| | | |
|---|---|---|
| G06F 11/30 | (2006.01) | |
| G11C 29/12 | (2006.01) | |
| G11C 29/04 | (2006.01) | |
| G06F 11/07 | (2006.01) | |
| G06F 11/22 | (2006.01) | |
| G06F 11/20 | (2006.01) | |

(Continued)

(52) U.S. Cl.
CPC ...... *G06F 11/3034* (2013.01); *G06F 11/3058* (2013.01); *G11C 29/04* (2013.01); *G11C 29/12005* (2013.01); *G06F 11/0772* (2013.01); *G06F 11/2074* (2013.01); *G06F 11/22* (2013.01); *G06F 11/3476* (2013.01); *G11C 2029/5006* (2013.01)

(58) Field of Classification Search
CPC ............ G06F 11/3034; G06F 11/3058; G06F 11/0772; G06F 11/2074; G06F 11/22; G06F 11/3476; G06F 11/008; G06F 11/24; G06F 11/0727; G06F 3/0614; G06F 11/2205; G06F 11/26; G06F 3/0653; G06F 3/0658; G06F 3/0679; G11C 29/04; G11C 29/12005; G11C 2029/5006
USPC ....................................................... 714/718
See application file for complete search history.

(56) References Cited

U.S. PATENT DOCUMENTS

| | | | | |
|---|---|---|---|---|
| 6,366,108 | B2 * | 4/2002 | O'Neill .............. | G01R 31/3004 324/762.01 |
| 7,397,721 | B2 | 7/2008 | Lee | |
| 8,817,570 | B2 | 8/2014 | McMahon et al. | |

(Continued)

FOREIGN PATENT DOCUMENTS

| | | |
|---|---|---|
| JP | 2003-249100 | 9/2003 |
| JP | 2013-037733 | 2/2013 |
| KR | 10-0154750 | 7/1998 |

*Primary Examiner* — James C Kerveros
(74) *Attorney, Agent, or Firm* — F. Chau & Associates, LLC

(57) ABSTRACT

A method of operating a storage device includes sensing a standby current flowing through the storage device, determining based on the sensed standby current and at least one reference value whether a product abnormality has occurred within the storage device, and when it is determined the product abnormality has occurred, performing a step-wise control operation in which two or more control processes associated with an operation of the storage device are sequentially executed.

20 Claims, 24 Drawing Sheets

(51) Int. Cl.
    *G06F 11/34*         (2006.01)
    *G11C 29/50*         (2006.01)

(56) References Cited

U.S. PATENT DOCUMENTS

| | | | |
|---|---|---|---|
| 8,984,216 B2 * | 3/2015 | Fillingim | G06F 11/1008 |
| | | | 713/320 |
| 2002/0167849 A1 * | 11/2002 | Ohbayashi | G11C 29/50 |
| | | | 365/189.09 |
| 2015/0071000 A1 * | 3/2015 | Namai | G11C 29/025 |
| | | | 365/185.17 |
| 2018/0358109 A1 | 12/2018 | Kwon et al. | |
| 2019/0279732 A1 * | 9/2019 | Huang | G11C 29/50 |

* cited by examiner

FIG. 10A

| Opcode (07) Generic Command | Opcode (06:02) Function | Opcode (01:00) Data Transfer | Opcode | O/M | Namespace Identifier Used | Command |
|---|---|---|---|---|---|---|
| 0b | 000 00b | 00b | 00h | M | No | Delete I/O Submission Queue |
| 0b | 000 00b | 01b | 01h | M | No | Create I/O Submission Queue |
| 0b | 000 00b | 10b | 02h | M | Yes | Get Log Page |
| 0b | 000 01b | 00b | 04h | M | No | Delete I/O Completion Queue |
| 0b | 000 01b | 01b | 05h | M | No | Create I/O Completion Queue |
| 0b | 000 01b | 10b | 06h | M | Yes | Identify |
| 0b | 000 10b | 00b | 08h | M | No | Abort |
| 0b | 000 10b | 01b | 09h | M | Yes | Set Features |
| 0b | 000 10b | 10b | 0Ah | M | Yes | Get Features |
| 0b | 000 11b | 00b | 0Ch | M | No | Asynchronous Event Request (AER) |
| 0b | 001 00b | 00b | 10h | O | No | Firmware Activate |
| 0b | 001 00b | 01b | 11h | O | No | Firmware Image Download |
| I/O Command Set Specific | | | 80h-BFh | O | | I/O Command Set specific |
| Vendor Specific | | | | | | |
| 1b | na | na | 80h-BFh | O | | I/O Command Set specific |
| 1b | na | na | C0h-FFh | O | | Vendor specific |

FIG. 10C

| | | | |
|---|---|---|---|
| 74 | 3.3V | CONFIG_2=GND | 75 |
| 72 | 3.3V | GND | 73 |
| 70 | 3.3V | GND | 71 |
| 68 | SUSCLK(32kHz) (I)(O/3.3V) | CONFIG_1=NC | 69 |
| 66 | Module Key | N/C | 67 |
| 64 | Module Key | Module Key | 65 |
| 62 | Module Key | Module Key | 63 |
| 60 | Module Key | Module Key | 61 |
| 58 | Reserved for MFG_CLOCK | Module Key | 59 |
| 56 | Reserved for MFG_DATA | GND | 57 |
| 54 | PEWAKE# (I/O)(O/3.3V) | REFCLKp | 55 |
| 52 | CLKREQ# (I/O)(O/3.3V) | REFCLKn | 53 |
| 50 | PERST# (I)(O/3.3V) | GND | 51 |
| 48 | N/C | PERp0 | 49 |
| 46 | N/C | PERn0 | 47 |
| 44 | N/C | GND | 45 |
| 42 | N/C | PETp0 | 43 |
| 40 | N/C | PETn0 | 41 |
| 38 | N/C | GND | 39 |
| 36 | N/C | PERp1 | 37 |
| 34 | N/C | PERn1 | 35 |
| 32 | N/C | GND | 33 |
| 30 | N/C | PETp1 | 31 |
| 28 | N/C | PETn1 | 29 |
| 26 | N/C | GND | 27 |
| 24 | N/C | N/C | 25 |
| 22 | N/C | N/C | 23 |
| 20 | N/C | CONFIG_0=GND | 21 |
| 18 | Module Key | Module Key | 19 |
| 16 | Module Key | Module Key | 17 |
| 14 | Module Key | Module Key | 15 |
| 12 | Module Key | Module Key | 13 |
| 10 | LED1# | N/C | 11 |
| 8 | N/C | N/C | 9 |
| 6 | N/C | N/C | 7 |
| 4 | 3.3V | N/C | 5 |
| 2 | 3.3V | GND | 3 |
| | | CONFIG_3=GND | 1 |

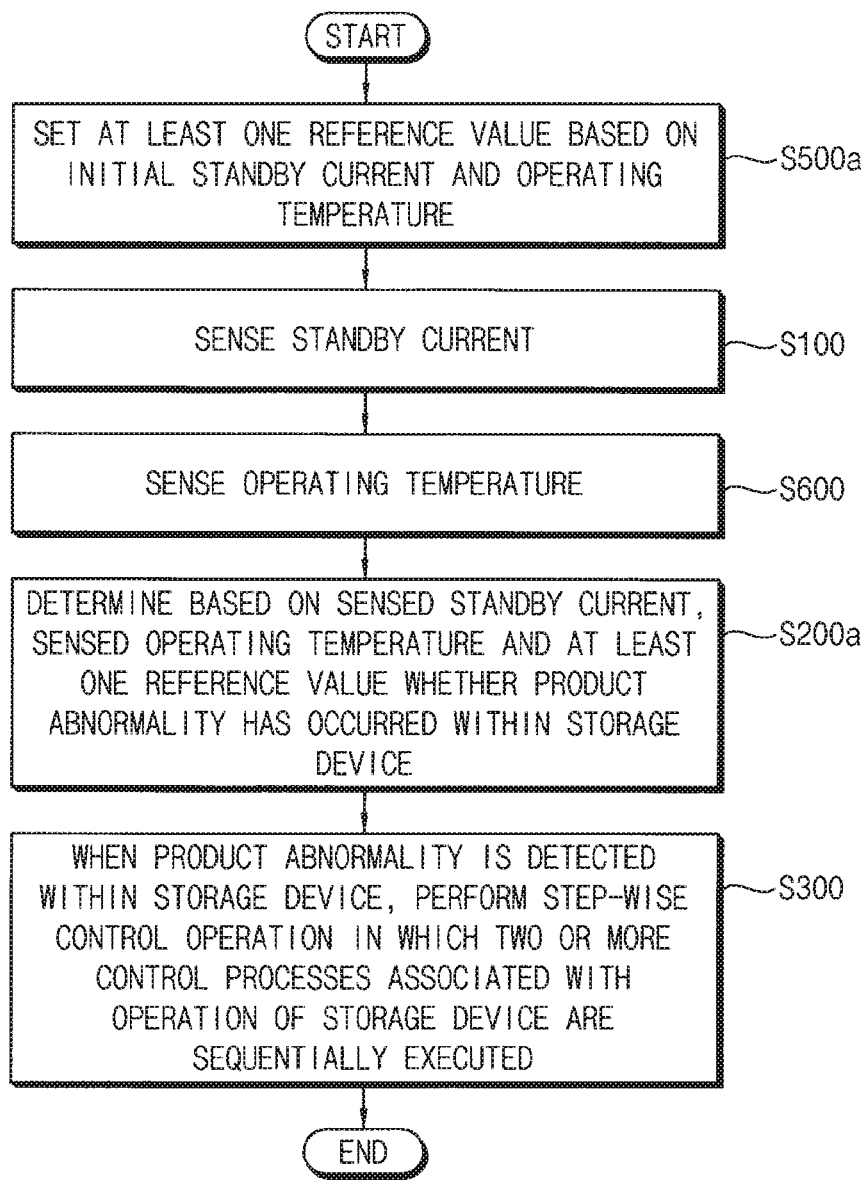

FIG. 17

```
START
  ↓
MEASURE FIRST INITIAL STANDBY CURRENT AT
FIRST TEMPERATURE, SECOND INITIAL STANDBY
CURRENT AT SECOND TEMPERATURE AND THIRD
INITIAL STANDBY CURRENT AT THIRD
TEMPERATURE                                    —S510
  ↓
SET FIRST REFERENCE VALUE, SECOND
REFERENCE VALUE AND THIRD REFERENCE VALUE
TO VALUES SUITABLE FOR FIRST TEMPERATURE
BASED ON FIRST INITIAL STANDBY CURRENT         —S540
  ↓
SET FIRST REFERENCE VALUE, SECOND
REFERENCE VALUE AND THIRD REFERENCE VALUE
TO VALUES SUITABLE FOR SECOND TEMPERATURE
BASED ON SECOND INITIAL STANDBY CURRENT        —S550
  ↓
SET FIRST REFERENCE VALUE, SECOND
REFERENCE VALUE AND THIRD REFERENCE VALUE
TO VALUES SUITABLE FOR THIRD TEMPERATURE
BASED ON THIRD INITIAL STANDBY CURRENT         —S560
  ↓
END
```

FIG. 18

|          | HT      | RT      | CT      |
|----------|---------|---------|---------|
| MEASURED | IRS1    | IRS2    | IRS3    |
| IREF1    | IRS1*X  | IRS2*X  | IRS3*X  |
| IREF2    | IRS1*Y  | IRS2*Y  | IRS3*Y  |
| IREF3    | IRS1*Z  | IRS2*Z  | IRS3*Z  |

METHOD OF OPERATING STORAGE DEVICE FOR IMPROVING RELIABILITY, STORAGE DEVICE PERFORMING THE SAME AND METHOD OF OPERATING STORAGE USING THE SAME

CROSS-REFERENCE TO RELATED APPLICATION

This U.S. non-provisional patent application claims priority under 35 USC § 119 to Korean Patent Application No. 10-2019-0098846, filed on Aug. 13, 2019 in the Korean Intellectual Property Office (KIPO), the disclosure of which is incorporated by reference in its entirety herein.

BACKGROUND

1. Technical Field

Exemplary embodiments relate generally to semiconductor integrated circuits, and more particularly to methods of operating storage devices for improvement of product reliability, storage devices performing the methods, and methods of operating storage systems including the storage devices.

2. Discussion of Related Art

Certain types of data storage devices include one or more semiconductor memory devices. Examples of such data storage devices include solid state drives (SSDs). These types of data storage devices may have various design and/or performance advantages over hard disk drives (HDDs). Examples of these advantages include the absence of moving mechanical parts, higher data access speeds, stability, durability, and/or lower power consumption.

An SSD may include a storage controller and a nonvolatile memory that are implemented in the form of a controller chip and a memory chip, respectively. The controller chip and/or the memory chip may be damaged as the usage time of the SSD increases, or when a surge voltage is received. In this case, product abnormalities, malfunctions and/or defects may occur, and it may be difficult to detect these failures especially in the case of progressive defects.

SUMMARY

At least one exemplary embodiment of the present disclosure provides a method of operating a storage device capable of efficiently detecting abnormal operations and improving product reliability.

At least one exemplary embodiment of the present disclosure provides a storage device that performs the method and has improved product reliability.

At least one exemplary embodiment of the present disclosure provides a method of operating a storage system that includes the storage device.

According to an exemplary embodiment of the inventive concept, a method of operating a storage device includes sensing a standby current flowing through the storage device, determining based on the sensed standby current and at least one reference value whether a product abnormality has occurred within the storage device, and when it is determined that the product abnormality has occurred, performing a step-wise control operation in which two or more control processes associated with an operation of the storage device are sequentially executed.

According to an exemplary embodiment of the inventive concept, a storage device includes a plurality of nonvolatile memories, a storage controller and a control circuit. The storage controller controls an operation of the plurality of nonvolatile memories. The control circuit senses a standby current of the storage device, determines based on the sensed standby current and at least one reference value whether a product abnormality has occurred within the storage device, and performs a step-wise control operation in which two or more control processes associated with an operation of the storage device are sequentially executed when the product abnormality has occurred. The standby current represents a sum of a current flowing through the storage controller and currents flowing through the plurality of nonvolatile memories.

According to an exemplary embodiment of the inventive concept, a method of operating a storage system including a storage device and a host device is provided. The method includes sensing a standby current flowing through the storage device during an idle interval during which no input/output signal is exchanged between the storage device and the host device. It is determined based on the sensed standby current, a first reference value, a second reference value and a third reference value whether a product abnormality has occurred within the storage device. The first, second and third reference values are different from each other. When the sensed standby current exceeds the first reference value and the product abnormality has occurred, the method includes performing a first control process that includes an operation of notifying the host device using an asynchronous event request (AER) command that the product abnormality has occurred, an operation of logging that the product abnormality has occurred, and an operation of identifying a location of a defective chip among a plurality of chips included in the storage device. When the sensed standby current exceeds the second reference value that is greater than the first reference value, the method includes performing a second control process that includes an operation of controlling an operating voltage applied to the defective chip, and an operation of enabling a dynamic throttling operation for the defective chip. When the sensed standby current exceeds a third reference value that is greater than the second reference value, the method includes performing a third control process that includes an operation of terminating driving of the defective chip.

In a method of operating a storage device, the storage device and a method of operating a storage system including the storage according to at least one exemplary embodiment of the inventive concept, the standby current flowing through the storage device may be sensed, and then a step-wise control operation for the storage device may be performed when a product abnormality is detected according to the sensing result. A malfunction of the storage device may be prevented by periodically sensing the standby current, user data stored in the storage device detected to have the abnormality may be moved to another storage device before the storage device is completely shut down to efficiently preserve the user data, and the sensing result may be used as indicators for product lifecycle and failure prediction. By utilizing the standby current as described above, it is possible to improve or enhance the overall product reliability of the storage device.

BRIEF DESCRIPTION OF THE DRAWINGS

Illustrative exemplary embodiments of the inventive concept will be more clearly understood from the following detailed description taken in conjunction with the accompanying drawings.

FIGS. 10A, 10B, 10C, 10D, 10E, 10F, 10G, 11A, 11B, 11C and 11D are diagrams for describing an operation of performing a first control process in FIG. 9.

FIG. 16 is a flowchart illustrating a method of operating a storage device according to an exemplary embodiment of the inventive concept.

FIG. 17 is a flowchart illustrating a method of setting at least one reference value in FIG. 16 according to an exemplary embodiment of the inventive concept.

FIG. 18 is a diagram for describing an operation of setting at least one reference value in FIG. 17.

DETAILED DESCRIPTION OF THE EXEMPLARY EMBODIMENTS

Figure 1:
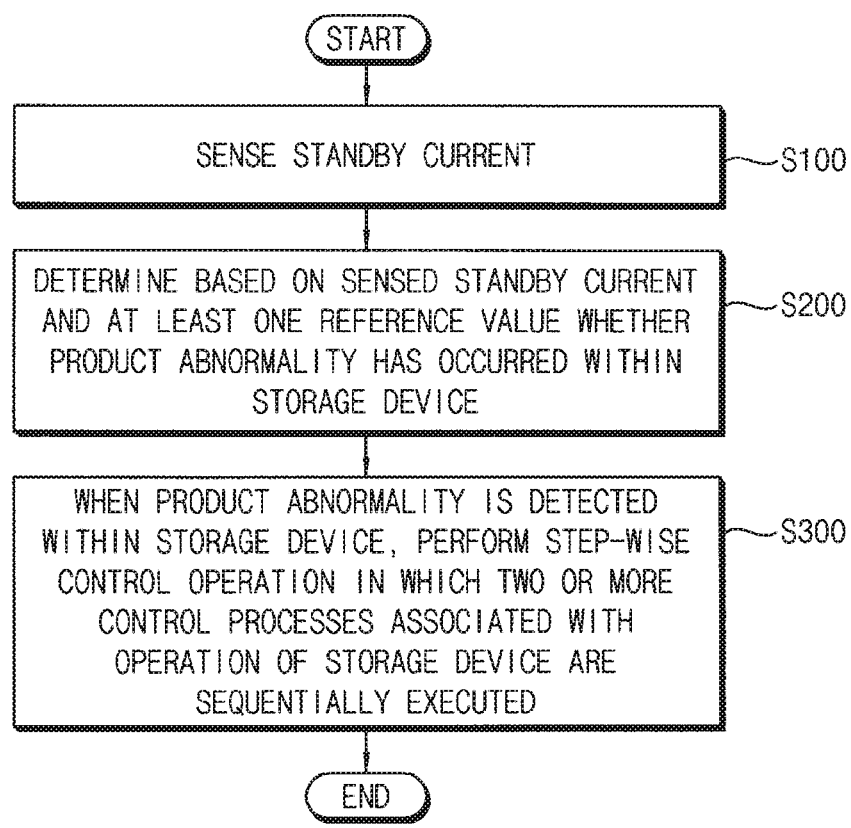
FIG. 1 is a flowchart illustrating a method of operating a storage device according to an exemplary embodiment of the inventive concept.

The inventive concept will be described more fully with reference to the accompanying drawings, in which exemplary embodiments are shown. The present disclosure may, however, be embodied in many different forms and should not be construed as limited to the embodiments set forth herein. Like reference numerals refer to like elements throughout this application.

FIG. 1 is a flowchart illustrating a method of operating a storage device according to an exemplary embodiment of the inventive concept.

Referring to FIG. 1, a storage device according to an exemplary embodiment includes a plurality of nonvolatile memories and a storage controller (e.g., a memory controller or a control circuit). The plurality of nonvolatile memories include a plurality of memory blocks that store data, and the storage controller controls operations of the plurality of nonvolatile memories. In an exemplary embodiment, the storage device further includes a sensing and control block (e.g., a control circuit) that senses a standby current and performs control operations based on the standby current. Configurations of the storage device and a storage system including the storage device will be described with reference to FIG. 2.

In a method of operating the storage device according to an exemplary embodiment of the inventive concept, the standby current flowing through the storage device is sensed or detected (step S100). The standby current may be referred to as an idle current or a leakage current, and may represent a current flowing through the storage controller and the plurality of nonvolatile memories while the storage device does not perform a normal operation. A detailed operation of sensing the standby current will be described with reference to FIGS. 5 through 7.

It is determined, checked or judged, based on the sensed standby current and at least one reference value, whether a product abnormality has occurred within the storage device (step S200). When the product abnormality is detected within the storage device, a step-wise control operation is performed for the storage device (step S300). The step-wise control operation represents an operation in which two or more control processes associated with an operation of the storage device are sequentially executed. For example, when the sensed standby current exceeds one reference value, one control process may be performed, and thus the number of reference values may be substantially equal to the number of control processes. Detailed operations of detecting the product abnormality and performing the step-wise control operation will be described with reference to FIGS. 8 through 12.

In the method of operating the storage device according to an exemplary embodiment of the inventive concept, the standby current flowing through the storage device is sensed to generate a sensing result, and then the step-wise control operation for the storage device is performed when the sensing result indicates the product abnormality has occurred. A malfunction of the storage device may be prevented by periodically sensing the standby current, user data stored in the storage device may be moved to another storage device before the storage device is completely shut down to efficiently preserve the user data, and the sensing result may be used as indicators for product lifecycle and failure prediction. By utilizing the standby current as described above, it is possible to improve or enhance the overall product reliability of the storage device.

Figure 2:
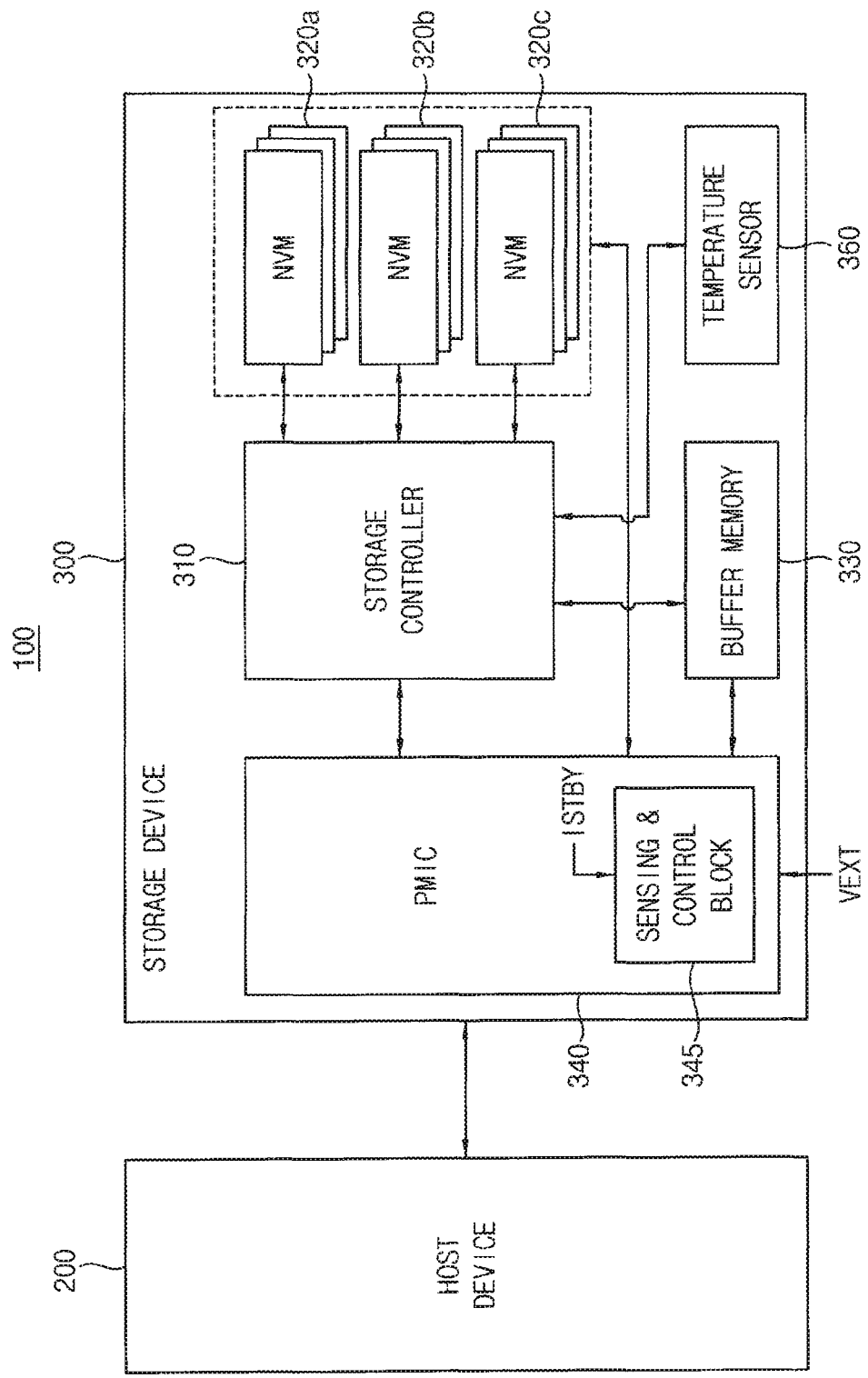
FIG. 2 is a block diagram illustrating a storage device and a storage system including the storage device according to an exemplary embodiment of the inventive concept.

FIG. 2 is a block diagram illustrating a storage device and a storage system including the storage device according to an exemplary embodiment of the inventive concept.

Referring to FIG. 2, a storage system 100 includes a host device 200 and a storage device 300.

The host device 200 controls overall operations of the storage system 100. Although not illustrated in FIG. 2, the host device 200 may include a host processor and a host memory. The host processor may control an operation of the host device 200. For example, the host processor may execute an operating system (OS). The host memory may store instructions and/or data that are executed and/or processed by the host processor. For example, the operating system executed by the host processor may include a file system for file management and a device driver for controlling peripheral devices including the storage device 300 at the operating system level.

The storage device 300 is accessed by the host device 200. The storage device 300 includes a storage controller 310 (e.g., a control circuit), a plurality of nonvolatile memories (NVMs) 320a, 320b and 320c, a buffer memory 330, a power management integrated circuit (PMIC) 340, a sensing and control block 345 (e.g., a control circuit), and a temperature sensor 360 (e.g., temperature transducer).

The storage controller 310 may control an operation of the storage device 300 and/or operations of the plurality of nonvolatile memories 320a, 320b and 320c based on a command and data that are received from the host device 200.

The plurality of nonvolatile memories 320a, 320b and 320c may store a plurality of data. For example, the plurality of nonvolatile memories 320a, 320b and 320c may store meta data or user data.

In an exemplary embodiment, each of the plurality of nonvolatile memories 320a, 320b and 320c includes a NAND flash memory. In other exemplary embodiments, each of the plurality of nonvolatile memories 320a, 320b and 320c may include one of an electrically erasable programmable read only memory (EEPROM), a phase change random access memory (PRAM), a resistance random access memory (RRAM), a nano floating gate memory (NFGM), a polymer random access memory (PoRAM), a magnetic random access memory (MRAM), or a ferroelectric random access memory (FRAM).

The buffer memory 330 may store instructions and/or data that are executed and/or processed by the storage controller 310, and may temporarily store data read from the plurality of nonvolatile memories 320a, 320b and 320c or data to be stored into the plurality of nonvolatile memories 320a, 320b and 320c. For example, the buffer memory 330 may include at least one of various volatile memories such as a dynamic random access memory (DRAM).

The PMIC 340 may generate and control a power signal supplied to the storage controller 310, the plurality of nonvolatile memories 320a, 320b and 320c and the buffer memory 330 based on an external power voltage VEXT. In other words, power supply voltages for driving the storage controller 310, the plurality of nonvolatile memories 320a, 320b and 320c and the buffer memory 330 may be controlled and regulated by the PMIC 340.

The sensing and control block 345 may be included in the PMIC 340 and may perform the method described with reference to FIG. 1. For example, the sensing and control block 345 senses a standby current ISTBY flowing through the storage device 300, determines based on the sensed standby current ISTBY and at least one reference value whether a product abnormality has occurred within the storage device 300, and performs a step-wise control operation when the product abnormality is detected within the storage device 300. In other words, the sensing and control block 345 may use or utilize the standby current ISTBY internally sensed by itself, and thus the overall product reliability of the storage device 300 may be improved or enhanced. In addition, the sensing and control block 345 may perform methods which will be described with reference to FIGS. 13 and 16.

In some exemplary embodiments, at least a part of the sensing and control block 345 is implemented as hardware. For example, at least a part of the sensing and control block 345 may be included in a computer-based electronic system. In another exemplary embodiment, at least a part of the sensing and control block 345 is implemented as instruction codes or program routines (e.g., a software program). For example, the instruction codes or the program routines may be executed by a computer-based electronic system, and may be stored in any storage device located inside or outside the computer-based electronic system.

In an exemplary embodiment of the inventive concept, as will be described with reference to FIGS. 13 and 16, the at least one reference value is determined during a process of manufacturing the storage device 300 and may be internally stored in the storage device 300.

In an exemplary embodiment, the standby current ISTBY represents a sum of a current flowing through the storage controller 310, currents flowing through the plurality of nonvolatile memories 320a, 320b and 320c and a current flowing through the buffer memory 330 while the storage device 300 does not perform a normal operation. In an exemplary embodiment, the normal operation is a read, a write, or an erase operation. In an exemplary embodiment, the buffer memory 330 is omitted, and the standby current ISTBY represents a sum of the current flowing through the storage controller 310 and the currents flowing through the plurality of nonvolatile memories 320a, 320b and 320c. In an exemplary embodiment, even when the buffer memory 300 is present, the standby current ISTBY is represented by a sum of the current flowing through the storage controller 310 and the currents flowing through the plurality of nonvolatile memories 320a, 320b and 320c since the current flowing through the buffer memory is ignored.

In an exemplary embodiment, the storage controller 310 is implemented in the form of at least one controller chip, the plurality of nonvolatile memories 320a, 320b and 320c are implemented in the form of a plurality of nonvolatile memory chips, and the buffer memory 330 is implemented in the form of at least one buffer memory chip. In this embodiment, the standby current ISTBY may represent a sum of a current flowing through the controller chip, currents flowing through the plurality of nonvolatile memory chips and a current flowing through the buffer memory chip. In an exemplary embodiment, the buffer memory 330 and the buffer memory chip are omitted, and the standby current ISTBY represents a sum of the current flowing through the controller chip and the currents flowing through the plurality of nonvolatile memory chips.

The temperature sensor 360 may sense an operating temperature of the storage device 300. In an exemplary embodiment, the sensed operating temperature is used to perform a dynamic throttling operation which will be described with reference to FIG. 12, or is used to determine whether the product abnormality has occurred which will be described with reference to FIG. 16.

For example, the temperature sensor 360 may be formed separately from the storage controller 310, the plurality of nonvolatile memories 320a, 320b and 320c, the buffer memory 330, the PMIC 340 and the sensing and control block 345, and may be mounted on a printed circuit board (PCB). In another example, the temperature sensor 360 may be included in at least one of the storage controller 310, the plurality of nonvolatile memories 320a, 320b and 320c, the buffer memory 330, the PMIC 340 and the sensing and control block 345, and may be an on-chip sensor (or on-die sensor) that includes an on-chip metal resistor.

In an exemplary embodiment of the inventive concept, the storage device 300 is a solid state drive (SSD). In other exemplary embodiments, the storage device 300 may be a universal flash storage (UFS), a multi media card (MMC) or an embedded multi media card (eMMC). In still other exemplary embodiments, the storage device 300 may be one of a secure digital (SD) card, a micro SD card, a memory stick, a chip card, a universal serial bus (USB) card, a smart card, or a compact flash (CF) card.

In some exemplary embodiments, the storage device 300 may be connected to the host device 200 via a block accessible interface which may include, for example, a UFS, an eMMC, a serial advanced technology attachment (SATA) bus, a nonvolatile memory express (NVMe) bus, or a serial attached SCSI (SAS) bus. The storage device 300 may use a block accessible address space corresponding to an access size of the plurality of nonvolatile memories 320a, 320b and 320c to provide the block accessible interface to the host device 200, for allowing the access by units of a memory block with respect to data stored in the plurality of nonvolatile memories 320a, 320b and 320c.

In some exemplary embodiments, the storage system 100 may be any mobile system, such as a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, or a drone. In other exemplary embodiments, the storage system 100 may be any computing system, such as a personal computer (PC), a server computer, a data center, a workstation, a digital television, a set-top box, or a navigation system.

Figure 3:
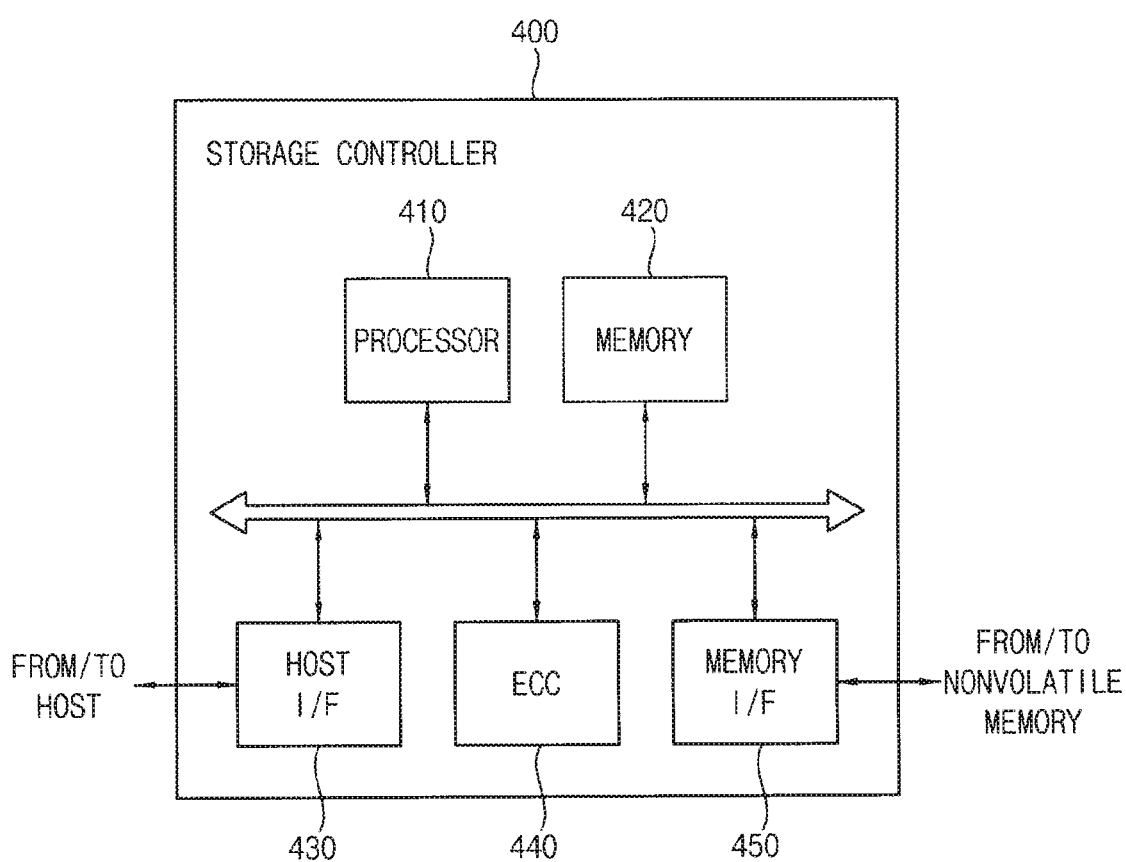
FIG. 3 is a block diagram illustrating an example of a storage controller included in a storage device according to an exemplary embodiment of the inventive concept.

FIG. 3 is a block diagram illustrating an example of a storage controller included in a storage device according to an exemplary embodiment of the inventive concept.

Referring to FIG. 3, a storage controller 400 includes at least one processor 410, a memory 420, a host interface 430 (e.g., an interface circuit), an error correction code (ECC) block 440 (e.g., an error correcting and/or checking circuit) and a memory interface 450 (e.g., an interface circuit).

The processor 410 may control an operation of the storage controller 400 in response to a command received via the host interface 430 from a host device (e.g., the host device 200 in FIG. 2). In some exemplary embodiments, the processor 410 may control respective components of the storage controller 400 by employing firmware for operating a storage device (e.g., the storage device 300 in FIG. 2).

The memory 420 may store instructions and data executed and processed by the processor 410. For example, the memory 420 may be implemented with a volatile memory device with relatively small capacity and high speed, such as a static random access memory (SRAM) or a cache memory.

The ECC block 440 for error correction may perform coded modulation using a Bose-Chaudhuri-Hocquenghem (BCH) code, a low density parity check (LDPC) code, a turbo code, a Reed-Solomon code, a convolution code, a recursive systematic code (RSC), a trellis-coded modulation (TCM), a block coded modulation (BCM), etc., or may perform ECC encoding and ECC decoding using above-described codes or other error correction codes.

The host interface 430 may provide physical connections between the host device 200 and the storage device 300. The host interface 430 may provide an interface corresponding to a bus format of the host for communication between the host device 200 and the storage device 300. In some exemplary embodiments, the bus format of the host device 200 may be a small computer system interface (SCSI) or a serial attached SCSI (SAS) interface. In other exemplary embodiments, the bus format of the host device 200 may be a USB format, a peripheral component interconnect (PCI) express (PCIe) format, an advanced technology attachment (ATA) format, a parallel ATA (PATA) format, a serial ATA (SATA) format, or a nonvolatile memory (NVM) express (NVMe) format.

The memory interface 450 may exchange data with nonvolatile memories (e.g., the nonvolatile memories 320a, 320b and 320c in FIG. 2). The memory interface 450 may transfer data to the nonvolatile memories 320a, 320b and 320c, or may receive data read from the nonvolatile memories 320a, 320b and 320c. In some exemplary embodiments, the memory interface 450 may be connected to the nonvolatile memories 320a, 320b and 320c via one channel. In other exemplary embodiments, the memory interface 450 may be connected to the nonvolatile memories 320a, 320b and 320c via two or more channels.

Figure 4:
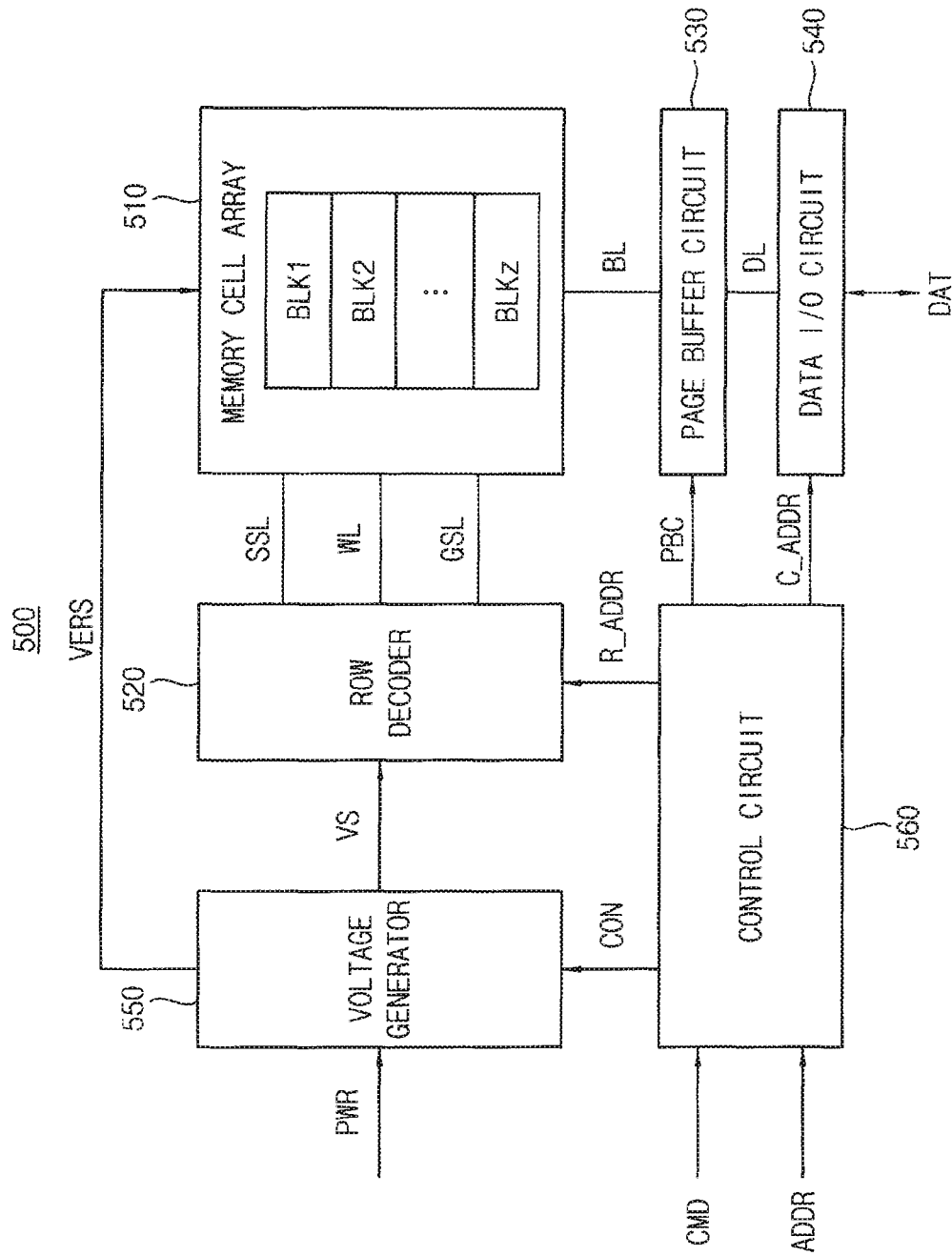
FIG. 4 is a block diagram illustrating an example of a nonvolatile memory included in a storage device according to an exemplary embodiment of the inventive concept.

FIG. 4 is a block diagram illustrating an example of a nonvolatile memory included in a storage device according to an exemplary embodiment of the inventive concept.

Referring to FIG. 4, a nonvolatile memory 500 includes a memory cell array 510, a row decoder 520 (e.g., a decoding circuit), a page buffer circuit 530, a data input/output (I/O) circuit 540, a voltage generator 550, and a control circuit 560.

The memory cell array 510 is connected to the row decoder 520 via a plurality of string selection lines SSL, a plurality of wordlines WL and a plurality of ground selection lines GSL. The memory cell array 510 is further connected to the page buffer circuit 530 via a plurality of bitlines BL. The memory cell array 510 may include a plurality of memory cells (e.g., a plurality of nonvolatile memory cells) that are connected to the plurality of wordlines WL and the plurality of bitlines BL. The memory cell array 510 may be divided into a plurality of memory blocks BLK1, BLK2, . . . , BLKz each of which includes memory cells. In addition, each of the plurality of memory blocks BLK1, BLK2, . . . , BLKz may be divided into a plurality of pages.

In some exemplary embodiments, the plurality of memory cells may be arranged in a two dimensional (2D) array structure or a three dimensional (3D) vertical array structure. A three-dimensional vertical array structure may include vertical cell strings that are vertically oriented such that at least one memory cell is located over another memory cell. The at least one memory cell may comprise a charge trap layer. The following patent documents, which are hereby incorporated by reference in their entirety, describe suitable configurations for a memory cell array including a 3D vertical array structure, in which the three-dimensional memory array is configured as a plurality of levels, with wordlines and/or bitlines shared between levels: U.S. Pat. Nos. 7,679,133; 8,553,466; 8,654,587; 8,559,235; and US Pat. Pub. No. 2011/0233648.

The control circuit 560 receives a command CMD and an address ADDR from the outside (e.g., the host device 200 and/or the storage controller 310 in FIG. 2), and control erasure, programming (e.g., writing) and read operations of the nonvolatile memory 500 based on the command CMD and the address ADDR. An erasure operation may include performing a sequence of erase loops, and a program operation may include performing a sequence of program loops. Each program loop may include a program operation (e.g., a write operation) and a program verification operation. Each erase loop may include an erase operation and an erase verification operation. The read operation may include a normal read operation and a data recover read operation.

For example, the control circuit 560 may generate control signals CON, which are used for controlling the voltage generator 550, and may generate a control signal PBC for controlling the page buffer circuit 530, based on the command CMD, and may generate a row address R_ADDR and a column address C_ADDR based on the address ADDR. The control circuit 560 may provide the row address R_ADDR to the row decoder 520 and may provide the column address C_ADDR to the data I/O circuit 540.

The row decoder 520 may be connected to the memory cell array 510 via the plurality of string selection lines SSL, the plurality of wordlines WL and the plurality of ground selection lines GSL.

For example, in the data erase/write/read operations, the row decoder 520 may determine at least one of the plurality of wordlines WL as a selected wordline, and may determine the rest or remainder of the plurality of wordlines WL other than the selected wordline as unselected wordlines, based on the row address R_ADDR.

In addition, in the data erase/write/read operations, the row decoder 520 may determine at least one of the plurality of string selection lines SSL as a selected string selection line, and may determine the rest or remainder of the plurality of string selection lines SSL other than the selected string selection line as unselected string selection lines, based on the row address R_ADDR.

Further, in the data erase/write/read operations, the row decoder 520 may determine at least one of the plurality of ground selection lines GSL as a selected ground selection line, and may determine the rest or remainder of the plurality of ground selection lines GSL other than the selected ground selection line as unselected ground selection lines, based on the row address R_ADDR.

The voltage generator 550 may generate voltages VS that are required for an operation of the nonvolatile memory 500 based on a power PWR (e.g., a supply voltage) and the control signals CON. The voltages VS may be applied to the plurality of string selection lines SSL, the plurality of wordlines WL and the plurality of ground selection lines GSL via the row decoder 520. In an exemplary embodiment, the voltage generator 550 generates an erase voltage VERS that is required for the data erase operation based on the power PWR and the control signals CON. The erase voltage VERS may be applied to the memory cell array 510 directly or via the bitline BL. For example, the voltage generator 550 may provide the erase voltage VERS to the memory cell array 510 directly using a signal line connecting the voltage generator 550 to the memory cell array 510.

For example, during the erase operation, the voltage generator 550 may apply the erase voltage VERS to a common source line and/or the bitline BL of a memory block (e.g., a selected memory block) and may apply an erase permission voltage (e.g., a ground voltage) to all wordlines of the memory block or a portion of the wordlines via the row decoder 520. In addition, during the erase verification operation, the voltage generator 550 may apply an erase verification voltage simultaneously to all wordlines of the memory block or sequentially to the wordlines one by one.

For example, during the program operation, the voltage generator 550 may apply a program voltage to the selected wordline and may apply a program pass voltage to the unselected wordlines via the row decoder 520. In addition, during the program verification operation, the voltage generator 550 may apply a program verification voltage to the selected wordline and may apply a verification pass voltage to the unselected wordlines via the row decoder 520.

In addition, during the normal read operation, the voltage generator 550 may apply a read voltage to the selected wordline and may apply a read pass voltage to the unselected wordlines via the row decoder 520. During the data recover read operation, the voltage generator 550 may apply the read voltage to a wordline adjacent to the selected wordline and may apply a recover read voltage to the selected wordline via the row decoder 520.

The page buffer circuit 530 may be connected to the memory cell array 510 via the plurality of bitlines BL. The page buffer circuit 530 may include a plurality of page buffers. In an exemplary embodiment, each page buffer is connected to one bitline. In another exemplary embodiment, each page buffer is connected to two or more bitlines.

The page buffer circuit 530 may store data DAT to be programmed into the memory cell array 510 or may read data DAT sensed from the memory cell array 510. In other words, the page buffer circuit 530 may operate as a write driver or a sensing amplifier according to an operation mode of the nonvolatile memory 500.

The data I/O circuit 540 may be connected to the page buffer circuit 530 via data lines DL. The data I/O circuit 540 may provide the data DAT from a source located outside the nonvolatile memory 500 to the memory cell array 510 via the page buffer circuit 530 or may provide the data DAT from the memory cell array 510 to the source located outside the nonvolatile memory 500, based on the column address C_ADDR.

Figure 5:
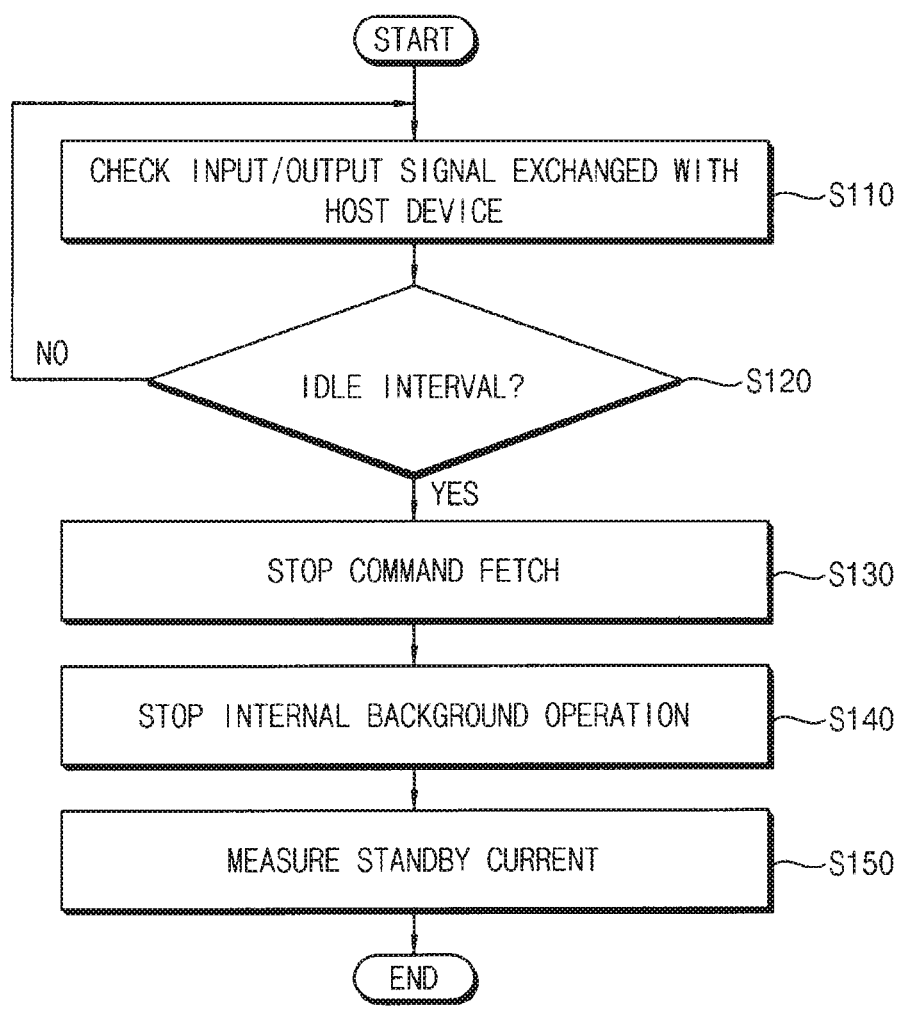
FIG. 5 is a flowchart illustrating a method of sensing a standby current in FIG. 1 according to an exemplary embodiment of the inventive concept.
Figure 6:
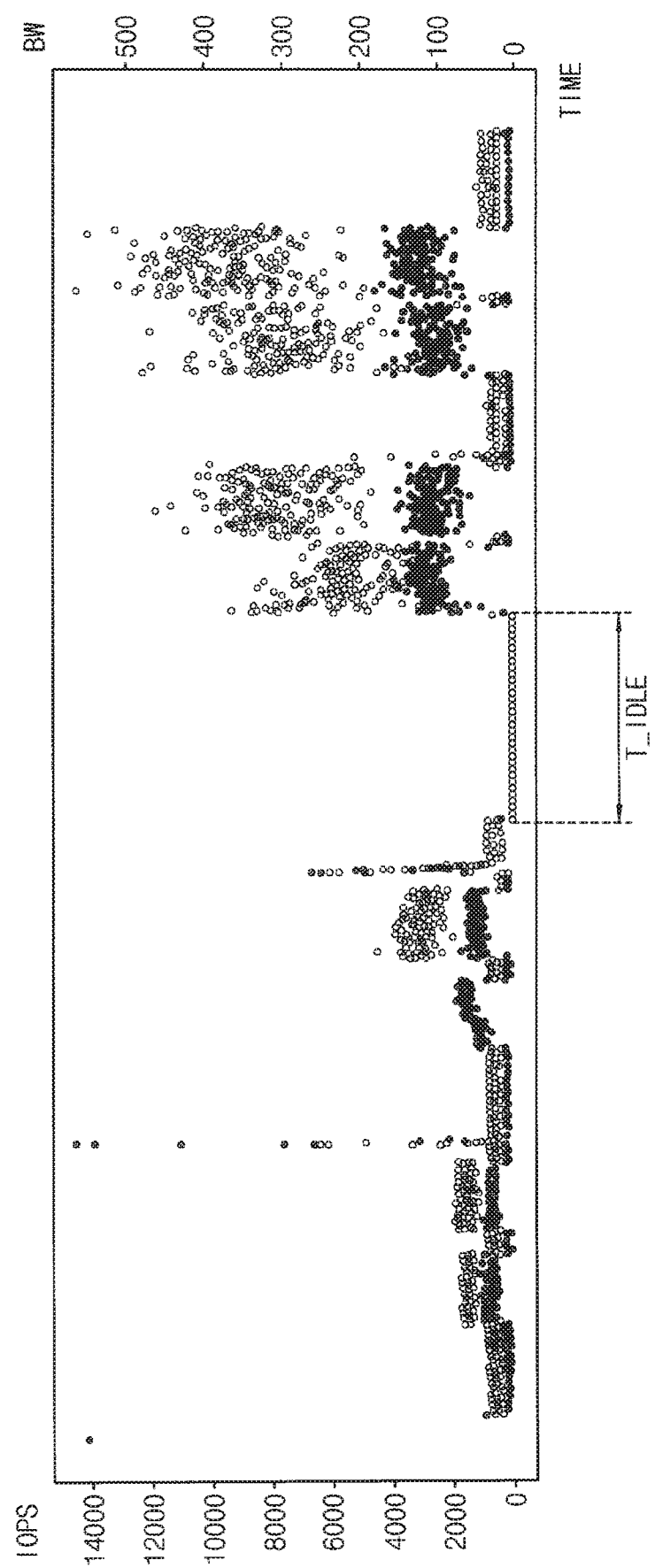
FIG. 6 is a diagram for describing an operation of sensing the standby current of FIG. 5.

FIG. 5 is a flowchart illustrating a method of sensing a standby current in FIG. 1 according to an exemplary embodiment of the inventive concept. FIG. 6 is a diagram for describing an operation of sensing the standby current of FIG. 5.

Referring to FIGS. 1, 5 and 6, when sensing the standby current (step S100), the operation of sensing the standby current may be performed during an idle interval (or period) in during which no input/output signal is exchanged between the storage device and the external host device while the storage device is driven.

While the storage device is driving or running (e.g., in real-time or during runtime), input/output signals exchanged between the storage device and the external host device are checked (step S110). For example, an input/output signal may be exchanged between the host device 200 and the storage device 300 when the host device 200 sends a command to the storage device 300, when the storage device 300 outputs read data to the host device 200 in response to a read command from the host device 200, or when the storage device 300 sends status information (e.g., status information indicating erase or write completed) to the host device 200 in response to a command from the host device 200. The checking may be performed one or more times during a certain time period. It may be inferred that one or more input/output operations have been performed during the time period by analyzing the corresponding input/output signals that occur during the time period. For example, a number of input/output operations per second may be determined from the length of the time period and the number of input/output operations that occurred during the time period.

It is determined whether the storage device enters the idle interval from results of the checking (step S120). For example, when input/output operations per second (IOPS) and bandwidth (BW) usage for the storage device are checked as illustrated in FIG. 6, there may be an idle interval T_IDLE in which the input/output operations do not occur at all. For example, a length of the idle interval T_IDLE may be longer than or equal to about one second. For example, when the TOPS or BW is below a certain threshold or 0 during a duration of the certain period, it may be concluded that the idle interval T_IDLE has occurred during the duration.

When the storage device does not enter the idle interval (step S120: NO), an operation of checking the input/output signal in step S110 may be repeatedly performed.

When the storage device enters the idle interval (step S120: YES), a command fetch operation may be stopped (step S130), and an internal background operation may be stopped (step S140). For example, an operation of executing commands (e.g., write commands) queued in a command queue may be suspended, and a background operation such as a subsequent operation after the operation of executing the commands (e.g., an operation of actually storing write data internally after an operation of executing the write commands) and/or a garbage collection operation may be suspended. For example, the garbage collection operation may include moving or copying valid data from first memory blocks to a second memory block to free up the first memory blocks. In an exemplary embodiment one of steps S130 and S140 is omitted.

The standby current may be measured during the idle interval (step S150). For example, the total current associated with the external power voltage VEXT may be measured, a current consumed by power blocks of the plurality of nonvolatile memories 320a, 320b and 320c may be measured after the power blocks are turned off, and the standby current may be measured based on the total current and the current consumed by the power blocks.

In an exemplary embodiment, the idle interval periodically occurs while the storage device is driven. Thus, the operation of sensing the standby current may be periodically performed for each idle interval, and the operation of determining based on the sensing result whether the product abnormality has occurred within the storage device may also be periodically performed. In an exemplary embodiment, the product abnormality has occurred when the standby current is greater than or equal a certain threshold and has not occurred when the standby current is less than the certain threshold.

Figure 7:
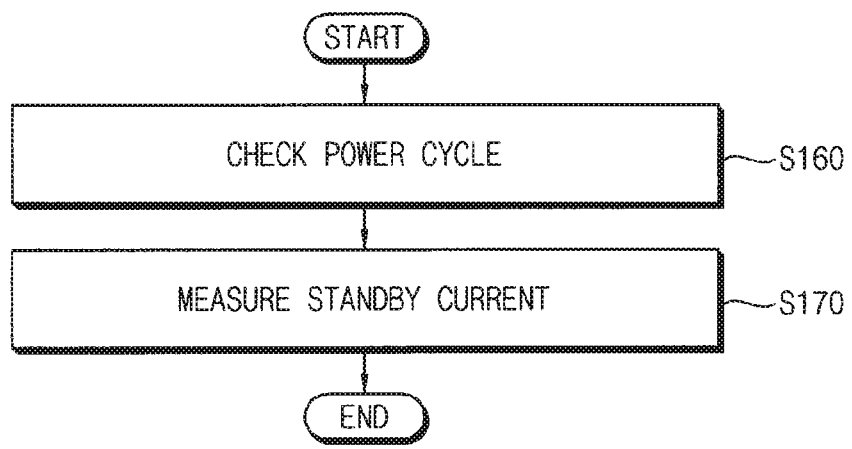
FIG. 7 is a flowchart illustrating another example of sensing a standby current in FIG. 1.

FIG. 7 is a flowchart illustrating a method of sensing a standby current in FIG. 1 according to an exemplary embodiment of the inventive concept.

Referring to FIGS. 1 and 7, when sensing the standby current (step S100), the operation of sensing the standby current may be performed during a power on reset (POR) interval immediately after the storage device is powered on.

A power cycle may be checked during a power on interval (or in a power on mode) for a power supply voltage immediately after the storage device is powered on (step S160), and the standby current may be measured during the power on interval (step S170). Step S170 in FIG. 7 may be substantially the same as step S150 in FIG. 5. Input/output signals are not exchanged between the storage device and the external host device during the POR interval or the power on interval for the power supply voltage, and thus the standby current may be measured immediately without an additional operation of checking the input/output operations.

For example, the checking of the power cycle may include determining whether the storage device has just been powered on.

Although FIGS. 5 through 7 illustrate examples where the operation of sensing the standby current is performed during the idle interval or the POR interval, exemplary embodiments of the inventive concept are not limited thereto, and the operation of sensing the standby current may be performed during any interval in which no input/output signals are being exchanged between the storage device and the external host device.

Figure 8:
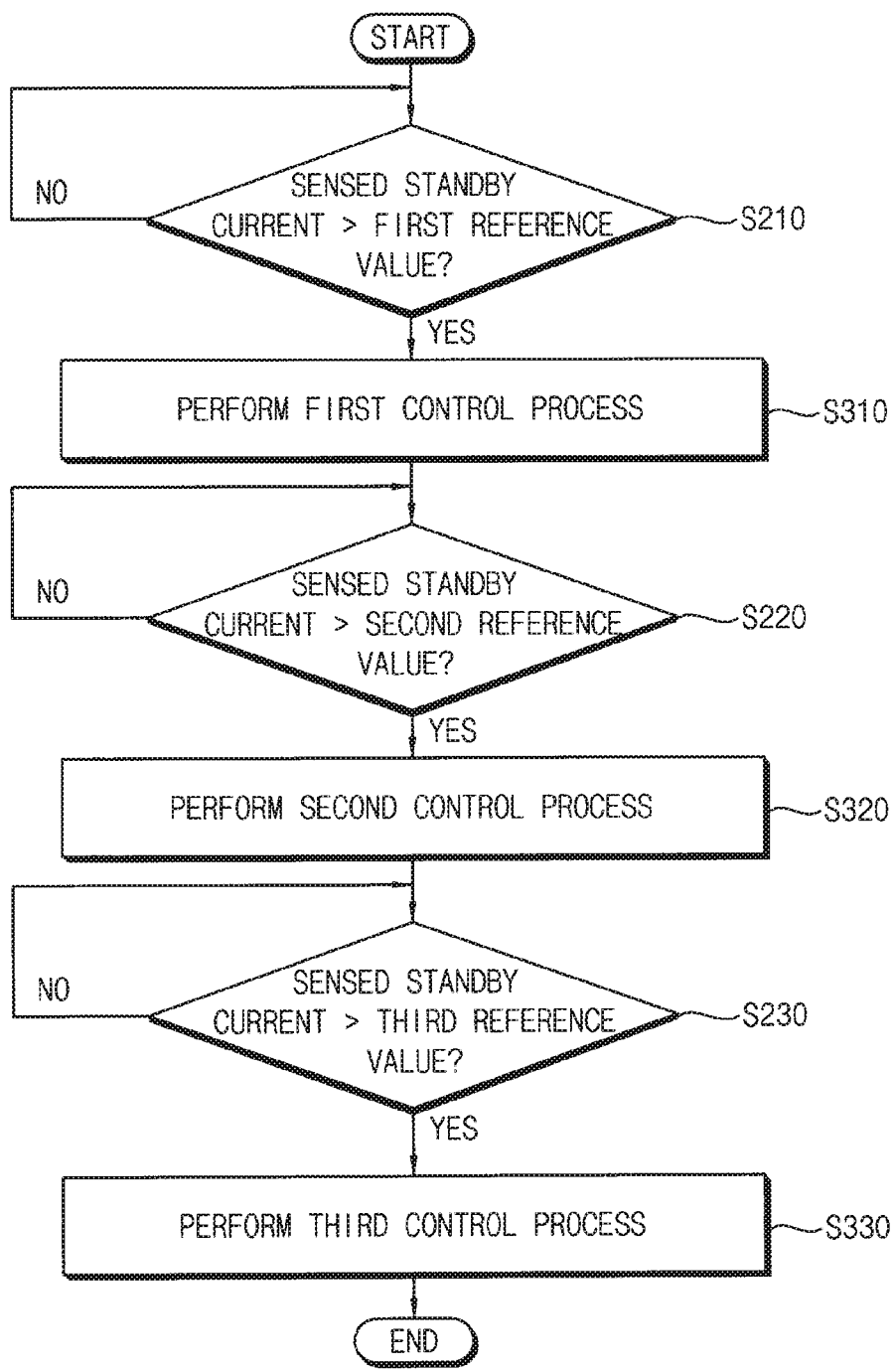
FIG. 8 is a flowchart illustrating a method of determining whether a product abnormality has occurred on a storage device and performing a step-wise control operation when the product abnormality is detected on the storage device in FIG. 1 according to an exemplary embodiment of the inventive concept.

FIG. 8 is a flowchart illustrating a method of determining whether a product abnormality has occurred within a storage device and performing a step-wise control operation when the product abnormality has been detected within the storage device in FIG. 1 according to an exemplary embodiment of the inventive concept.

Referring to FIGS. 1 and 8, when determining based on the sensed standby current and the at least one reference value whether the product abnormality has occurred within the storage device (step S200), and when performing the step-wise control operation for the storage device when the product abnormality has been detected within the storage device (step S300), the at least one reference value may include a first reference value, a second reference value and a third reference value that are different from each other, and three steps of control operation may be performed based on the first, second and third reference values.

When the sensed standby current exceeds the first reference value (step S210: YES), it is determined or judged that the product abnormality has occurred, and a first control process that includes an operation of identifying a location of a defective chip is performed (step S310). The first control process will be described with reference to FIG. 9.

When the sensed standby current is less than or equal to the first reference value (step S210: NO), any follow-up actions are not performed, and steps S100 and S210 may be repeated periodically.

When the sensed standby current exceeds the second reference value that is greater than the first reference value (step S220: YES), it is determined or judged that the product abnormality has become worse, and a second control process that includes an operation of controlling performance of the defective chip is performed (step S320). The second control process will be described with reference to FIG. 12.

When the sensed standby current exceeds the first reference value but is less than or equal to the second reference value (step S220: NO), steps S100 and S220 may be repeated periodically after step S310 is performed.

When the sensed standby current exceeds the third reference value that is greater than the second reference value (step S230: YES), it is determined or judged that the product abnormality has become so severe that no further action can mitigate the excessive standby current, and a third control process that includes an operation of terminating or stopping driving of the defective chip is performed (step S330). In other words, the defective chip may be shut down to prevent its subsequent use.

When the sensed standby current exceeds the second reference value but is less than or equal to the third reference value (step S230: NO), steps S100 and S230 may be repeated periodically after step S320 is performed.

Although FIG. 8 illustrates an example where the three steps of control operation is performed, exemplary embodiments of the inventive concept are not limited thereto. For example, a step-wise control operation including a plurality of steps of two steps or four or more steps may be performed.

Figure 9:
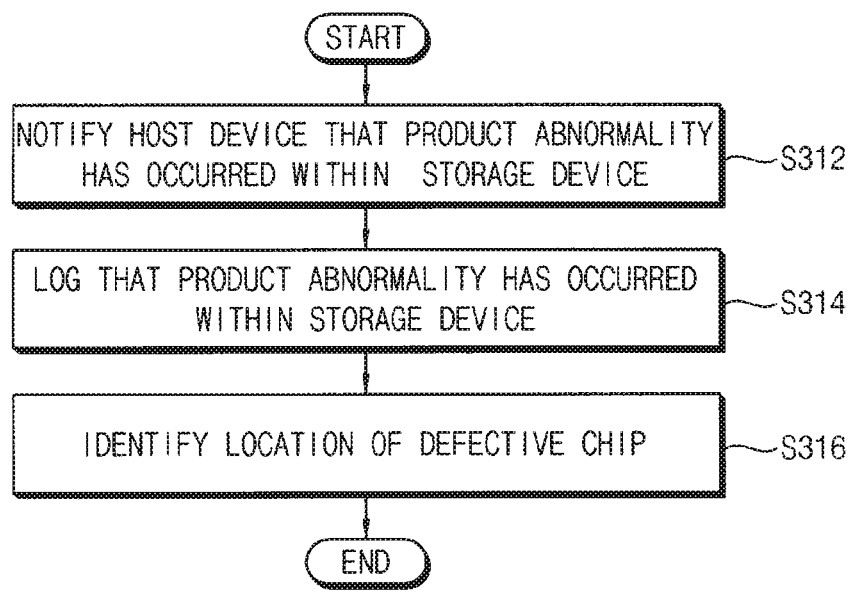
FIG. 9 is a flowchart illustrating a method of performing a first control process in FIG. 8 according to an exemplary embodiment of the inventive concept.

FIG. 9 is a flowchart illustrating a method of performing the first control process in FIG. 8 according to an exemplary embodiment of the inventive concept. FIGS. 10A, 10B, 10C, 10D, 10E, 10F, 10G, 11A, 11B, 11C and 11D are diagrams for describing an operation of performing the first control process in FIG. 9.

Referring to FIGS. 8, 9, 10A, 10B, 10C, 10D, 10E, 10F, 10G, 11A, 11B, 11C and 11D, when performing the first control process (step S310), the external host device is notified that a product abnormality has occurred within the storage device (step S312). For example, the storage device 300 may notify the host device 200 that the product abnormality has occurred or send an alarm to the host device 200 indicating that the product abnormality has occurred.

In an exemplary embodiment, the operation of notifying the external host device that the product abnormality has occurred within the storage device is implemented by a software scheme, e.g., may be performed using an asynchronous event request (AER) command. For example, FIG. 10A illustrates a part of commands according to the NVMe standard, which includes the AER command as illustrated by dotted line. For example, the storage device 300 may transmit an AER command to the host device 200 indicating that the product abnormality has occurred.

The AER command is a command used to transmit related information to a host device when a device error or a health related event occurs. For example, an AER event may include an error event (e.g., error information) including a general error that is not an error of a specific command, a SMART or Health Status event, or other vendor specific events. When the AER event occurs but there is no request command for the AER event, the event may be stored in the controller and reported to the host device when the request command occurs.

In another exemplary embodiment, the operation of notifying the external host device that the product abnormality has occurred within the storage device is implemented by a hardware scheme, e.g., may be performed based on a general purpose input/output (GPIO) function.

Figure 10B:
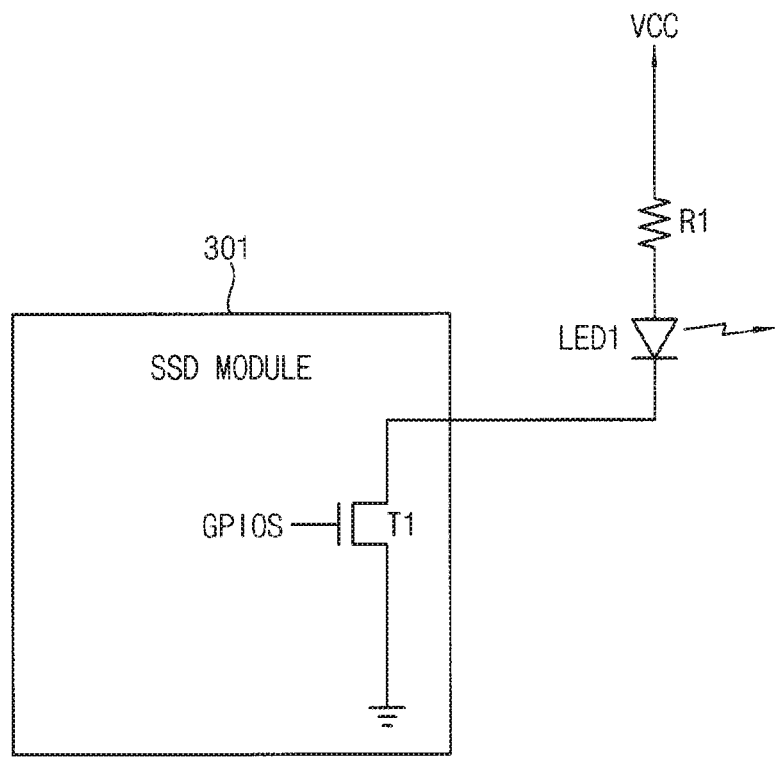

For example, as illustrated in FIG. 10B, a system light emitting diode (LED) may be controlled (e.g., turned on) to notify the external host device that the product abnormality has occurred within the storage device. For example, a storage module 301 may include a transistor T1 receiving a GPIO signal GPIOS, and the transistor T1 may be connected to a power supply voltage VCC through an external LED LED1 and a resistor R1. The LED LED1 may emit light based on a level of the GPIO signal GPIOS to notify that the product abnormality has occurred. For example, a GPIO for supporting an LED function included in the storage module 301 may be used, or a GPIO for detecting the product abnormality may be additionally provided.

In addition, as illustrated in FIGS. 10C, 10D, 10E, 10F and 10G, a N/C (no connect) pin or a CONFIG pin of a storage module may be used to notify the external host device that the product abnormality has occurred within the storage device. For example, FIG. 10C illustrates a part of placement and function of pins of the storage module. In FIG. 10C, numbers represent pin numbers and letters represent pin functions. The pins labeled N/C or CONFIG_1 in FIG. 10C may be used.

Figure 10D:
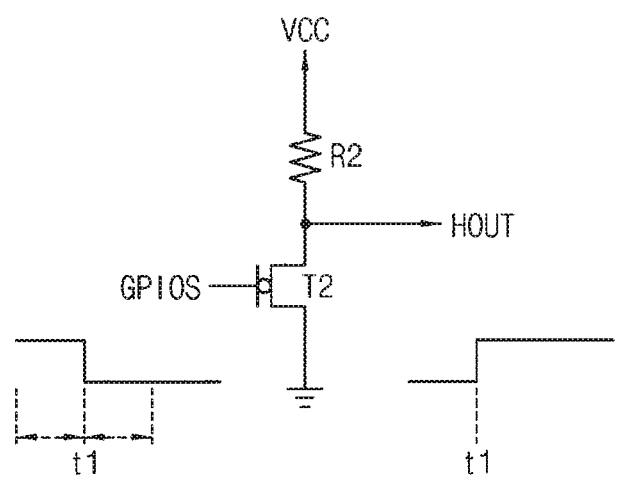
Figure 10E:
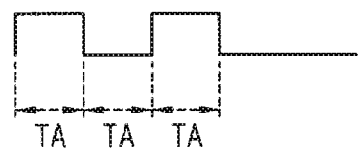
Figure 10F:
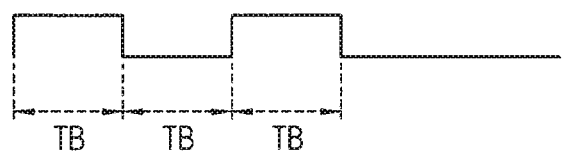
Figure 10G:
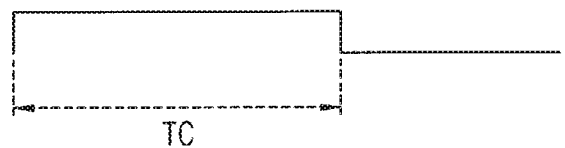

Further, a circuit structure illustrated in FIG. 10D and the above-described N/C pin may be used to notify the external host device that the product abnormality has occurred within the storage device. A notification circuit of FIG. 10D may include a transistor T2 receiving a GPIO signal GPIOS. The transistor T2 may be connected to the power supply voltage VCC through a resistor R2 and may output a notification signal HOUT. The GPIO signal GPIOS may have a high level during an idle interval and a low level during an urgent interval. For example, when the GPIO signal GPIOS is transitioned from the high level to the low level at a first time point t1, the notification signal HOUT may be transitioned from the low level to the high level at the first time point t1. Additionally, each step may be recognized by a width of a pulse (e.g., a width of a high level state) in a normal interval. For example, it may indicate that the sensed standby current exceeds the first reference value when a signal is toggled with a first time interval TA as illustrated in FIG. 10E. For example, it may indicate that the sensed standby current exceeds the second reference value when a signal is toggled with a second time interval TB as illustrated in FIG. 10F. For example, it may indicate that the sensed standby current exceeds the third reference value when a signal is toggled with a third time interval TC as illustrated in FIG. 10G or when a signal always has a high level. For example, the second time interval TB may be longer than the first time interval TA and shorter than the third time interval TC. For example, the signals in FIGS. 10E, 10F and 10G may be the GPIO signal GPIOS or the notification signal HOUT.

After that, it is logged or recorded that the product abnormality has occurred within the storage device (step S314). For example, the occurrence of the product abnormality may be internally logged in the storage device, may be logged in a separate area outside the storage device, or may be logged both in a location inside the storage device and the outside the storage device.

The location of a defective chip among a plurality of chips included in the storage device is identified or checked (step S316). As described with reference to FIG. 2, the storage controller 310 may be implemented in the form of the at least one controller chip, the plurality of nonvolatile memories 320a, 320b and 320c may be implemented in the form of the plurality of nonvolatile memory chips. The defective chip may be detected among the plurality of chips including the controller chip and the plurality of nonvolatile memory chips.

In an exemplary embodiment, the defective chip is detected by sequentially turning on the plurality of chips one by one and by sensing a current flowing through each turned-on chip.

Figure 11A:
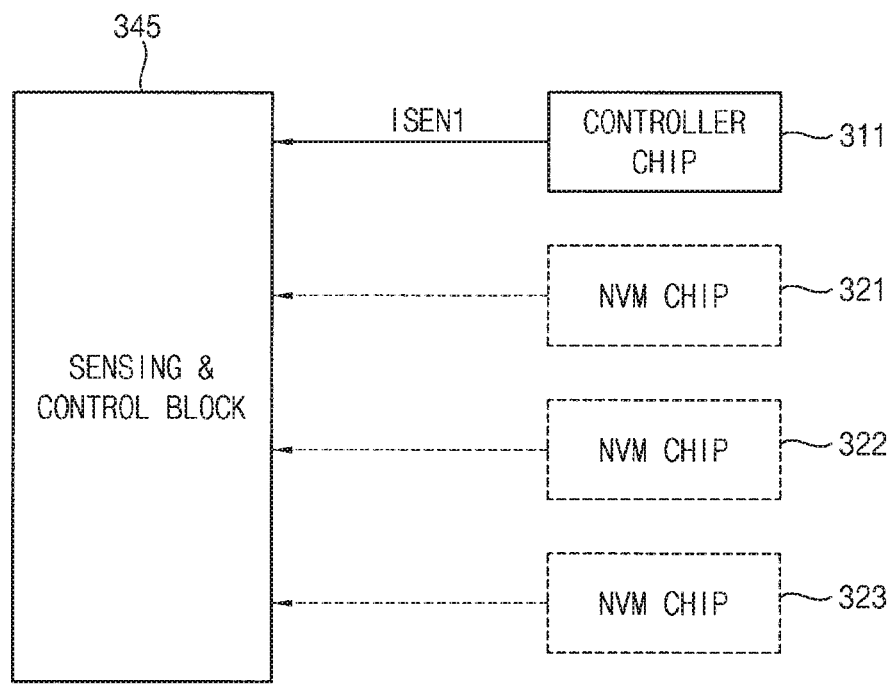

For example, as illustrated in FIGS. 11A, 11B, 11C and 11D, the storage device may include a controller chip 311 and nonvolatile memory chips 321, 322 and 323. First of all, as illustrated in FIG. 11A, only the controller chip 311 is turned on, and the remaining chips 321, 322 and 323 are turned off. For example, a memory chip requires a certain amount of power to operate and thus the memory chip may be turned off by blocking the supply of this power to the memory chip. In FIGS. 11A, 11B, 11C and 11D, the turned-off chips (e.g., the nonvolatile memory chips 321, 322 and 323 in FIG. 11A) are illustrated by dotted lines. The sensing and control block 345 included in the storage device may sense a current ISEN1 flowing through the controller chip 311.

Figure 11B:
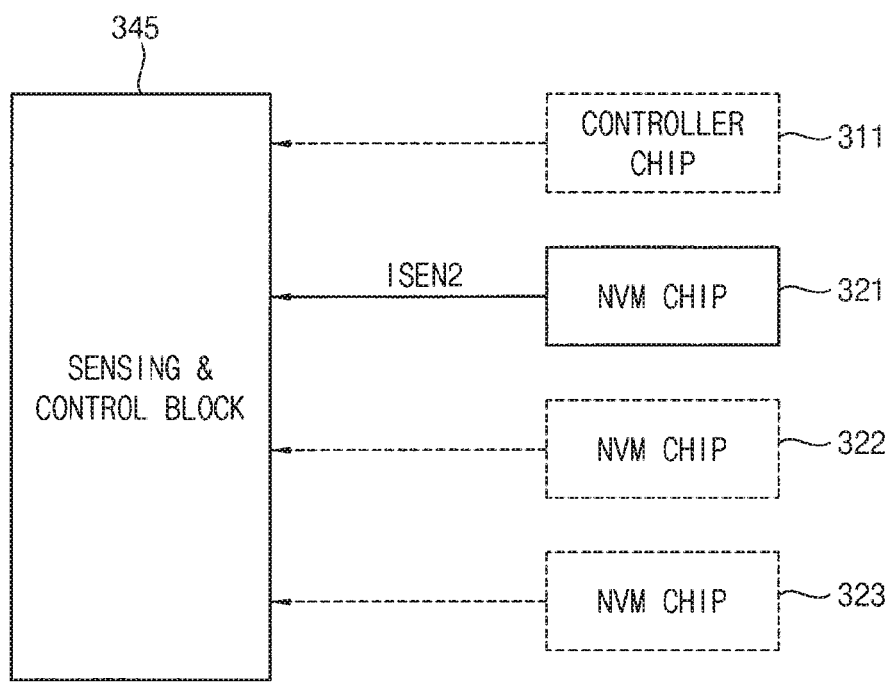
Figure 11C:
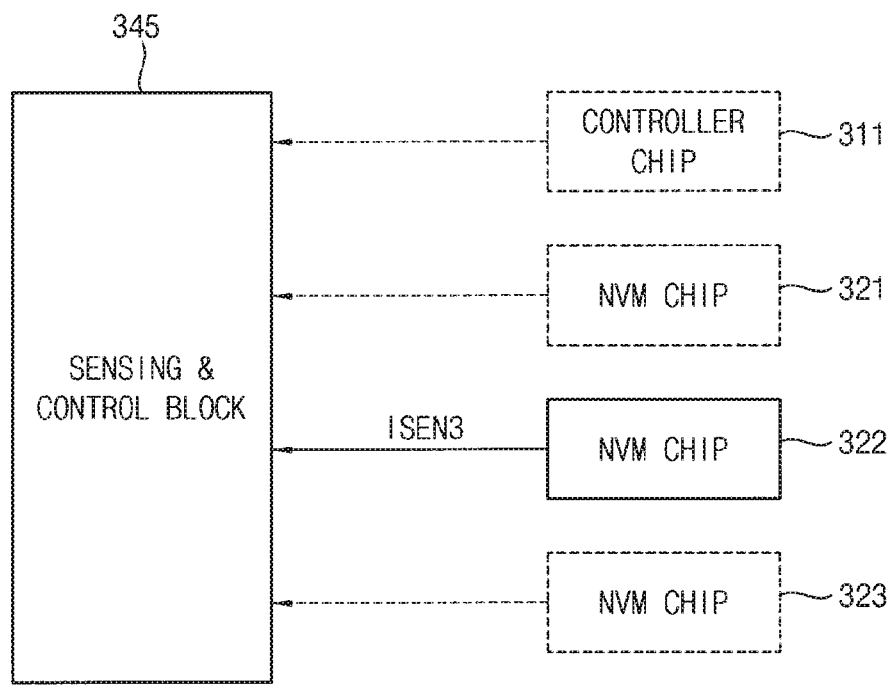
Figure 11D:
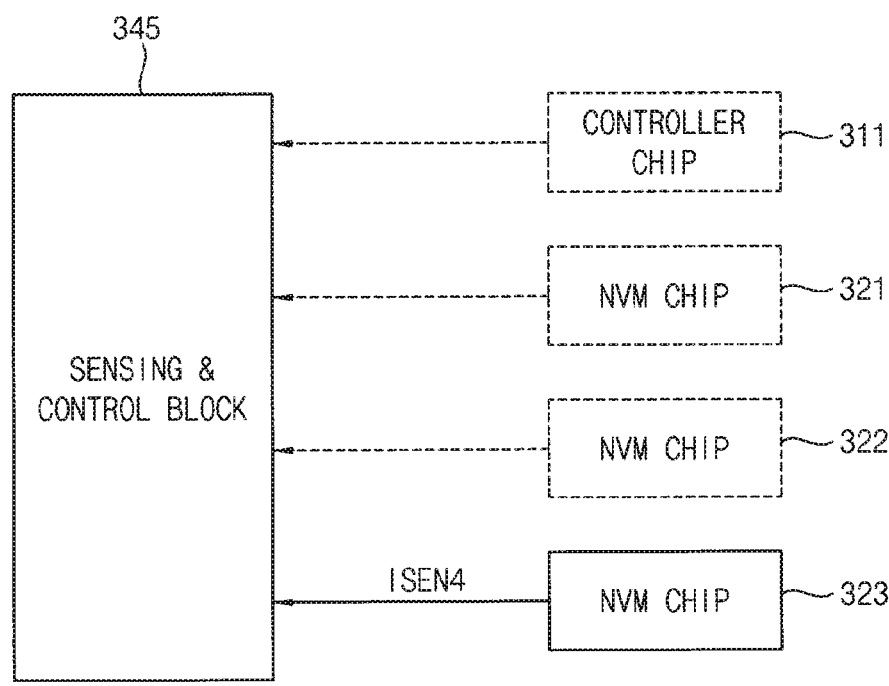

After that, as illustrated in FIG. 11B, only the nonvolatile memory chip 321 is turned on, the remaining chips 311, 322 and 323 are turned off, and the sensing and control block 345 may sense a current ISEN2 flowing through the nonvolatile memory chip 321. Similarly, as illustrated in FIG. 11C, only the nonvolatile memory chip 322 is turned on, the remaining chips 311, 321 and 323 are turned off, and the sensing and control block 345 may sense a current ISEN3 flowing through the nonvolatile memory chip 322. Further, as illustrated in FIG. 11D, only the nonvolatile memory chip 323 is turned on, the remaining chips 311, 321 and 322 are turned off, and the sensing and control block 345 senses a current ISEN4 flowing through the nonvolatile memory chip 323.

The sensing and control block 345 may determine an abnormal current among the sensed currents ISEN1, ISEN2, ISEN3 and ISEN4 and may identify the location of the defective chip based on the abnormal current. For example, when the current ISEN1 is the abnormal current, the sensing and control block 345 may determine that the controller chip 311 from which the current ISEN1 is sensed is the defective chip. For example, the sensing and control block 345 may determine that the controller chip 311 is the defective chip when the current ISEN1 is greater than or equal a certain threshold current.

Although not illustrated in FIGS. 11A, 11B, 11C and 11D, the buffer memory 330 may also be implemented in the form of the at least one buffer memory chip. In this example, the defective chip may be detected among the plurality of chips including the controller chip, the plurality of nonvolatile memory chips and the buffer memory chip.

Figure 12:
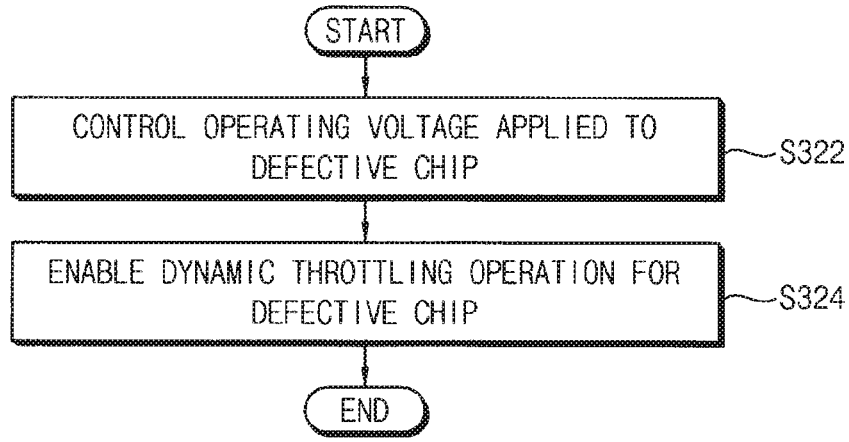
FIG. 12 is a flowchart illustrating a method of performing a second control process in FIG. 8 according to an exemplary embodiment of the inventive concept.

FIG. 12 is a flowchart illustrating a method of performing a second control process in FIG. 8 according to an exemplary embodiment of the inventive concept.

Referring to FIGS. 8 and 12, when performing the second control process (step S320), an operating voltage applied to the defective chip is controlled (step S322), and a dynamic throttling operation for the defective chip is enabled (step S324). Until the defective chip is shut down, it may be necessary to prevent the defective chip from operating abnormally even if performance decreases. Thus, the performance of the defective chip may be intentionally reduced by controlling the operating voltage and by enabling the dynamic throttling operation. In an exemplary embodiment, the step (S322) of controlling the operating voltage reduces the operating voltage to a lower level that still enables the defective chip to operate. In an exemplary embodiment, the step (S324) of enabling the dynamic throttling operation for a given defective chip reduces the number of transactions the defective chip is involved in. For example, some data within the defective chip may be moved to a non-defective chip or some data to be written to the defective chip may instead be written to a non-defective chip.

In an exemplary embodiment, the dynamic throttling operation is performed based on the operating temperature of the storage device and the sensed standby current. In other words, in addition to performing a dynamic thermal throttling (DTT) operation to reduce throughput based on the temperature, an additional throttling operation may be further performed based on the standby current.

Figure 13:
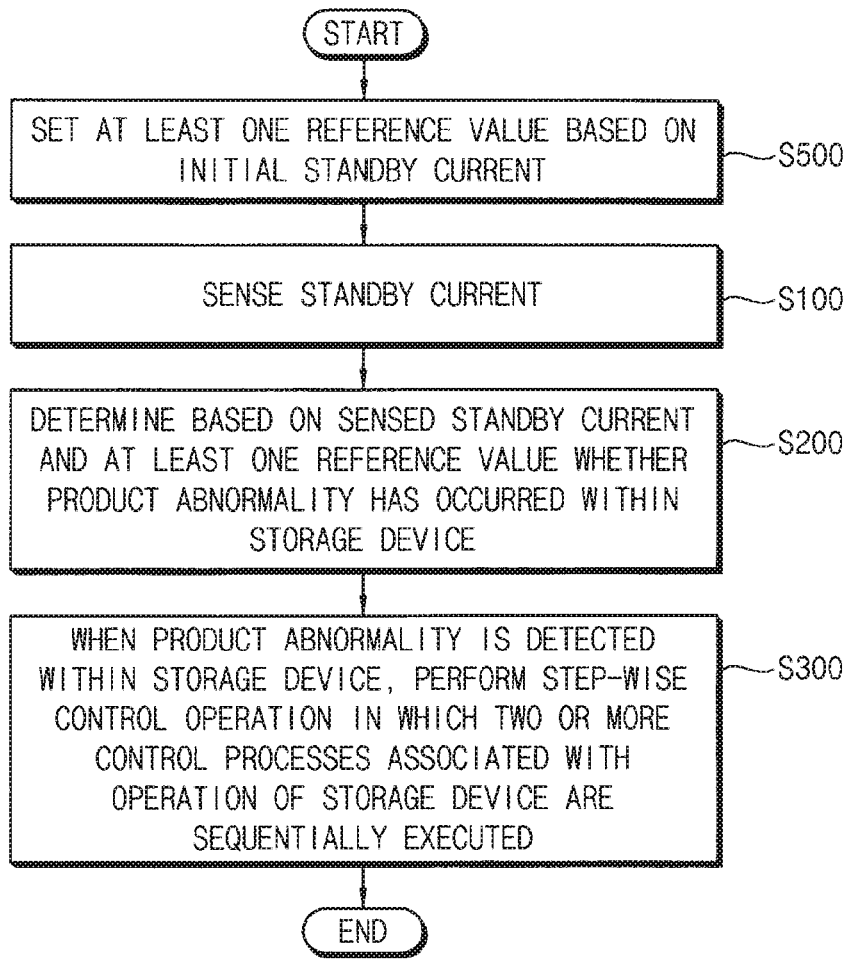
FIG. 13 is a flowchart illustrating a method of operating a storage device according to an exemplary embodiment of the inventive concept.

FIG. 13 is a flowchart illustrating a method of operating a storage device according to an exemplary embodiment of the inventive concept. The descriptions repeated with FIG. 1 will be omitted.

Referring to FIG. 13, in a method of operating a storage device according to an exemplary embodiment, at least one reference value is set based on an initial standby current (or a default standby current) that is measured in a process of manufacturing the storage device (step S500). Steps S100, S200 and S300 in FIG. 13 after step S500 may be substantially the same as steps S100, S200 and S300 in FIG. 1, respectively.

In an exemplary embodiment, an operation of setting the at least one reference value in step S500 is performed only when the storage device is manufactured. For example, step S500 may be performed once by an external fabricating and/or testing equipment at the time of manufacturing the storage device, and the at least one reference value may be set and stored. After that, step S500 may be replaced with an operation of loading the at least one reference value already stored in the storage device. In this example, steps S100, S200 and S300 may be performed based on the loaded reference value.

Figures 14, 15:
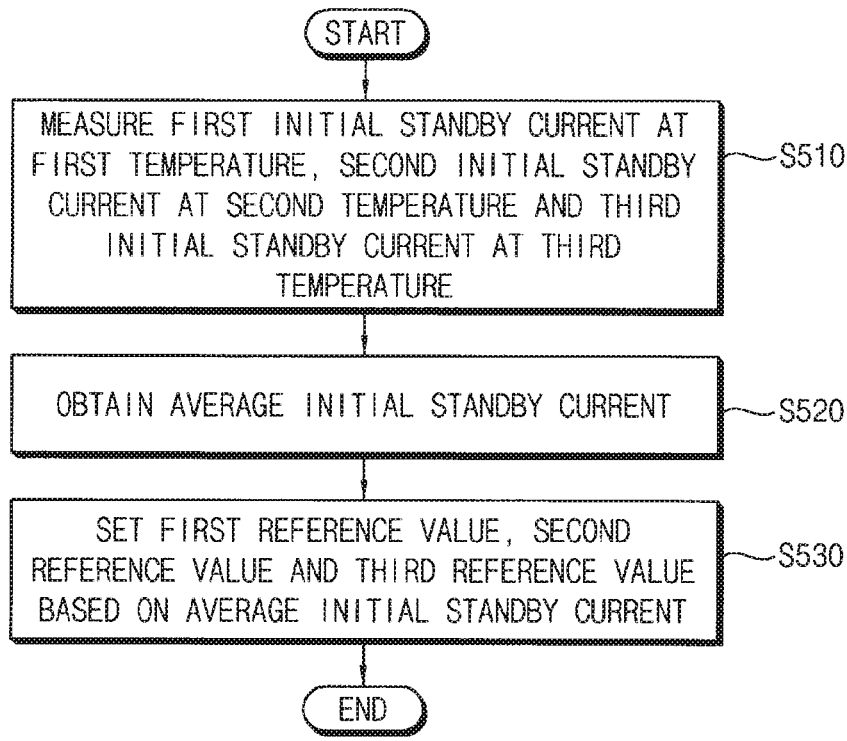
FIG. 14 is a flowchart illustrating a method of setting at least one reference value in FIG. 13 according to an exemplary embodiment of the inventive concept.
FIG. 15 is a diagram for describing an operation of setting at least one reference value in FIG. 14.

FIG. 14 is a flowchart illustrating a method of setting at least one reference value in FIG. 13 according to an exemplary embodiment of the inventive concept. FIG. 15 is a diagram for describing an operation of setting at least one reference value in FIG. 14.

Referring to FIGS. 13, 14 and 15, when setting the at least one reference value based on the initial standby current (step S500), the initial standby current may include two or more initial standby currents that are measured at different temperatures, and the at least one reference value may be set based on an average initial standby current obtained by averaging the two or more initial standby currents. FIGS. 14 and 15 illustrate an example where the at least one reference value includes the first, second and third reference values.

A first initial standby current IRS1 at a first temperature HT, a second initial standby current IRS2 at a second temperature RT and a third initial standby current IRS3 at a third temperature CT are measured (step S510). For example, the second temperature RT may be a room temperature, the first temperature HT may be a high temperature higher than the room temperature, and the third temperature CT may be a cold temperature lower than the room temperature.

For example, as with step S150 in FIG. 5, when measuring the initial standby currents IRS1, IRS2 and IRS3, the total current associated with the external power voltage VEXT may be measured by temperature, a current consumed by power blocks of the plurality of nonvolatile memories 320a, 320b and 320c may be measured by temperature after the power blocks are turned off, and the initial standby currents IRS1, IRS2 and IRS3 may be measured based on the total current and the current consumed by the power blocks.

An average initial standby current IRS_AVG is obtained by averaging the first initial standby current IRS1, the second first standby current IRS2 and the third first standby current IRS3 (step S520). A first reference value IREF1, a second reference value IREF2 and a third reference value IREF3 are set based on the average initial standby current IRS_AVG (step S530). For example, the first reference value IREF1 may be obtained by multiplying the average initial standby current IRS_AVG by X, where X is a positive real number, the second reference value IREF2 may be obtained by multiplying the average initial standby current IRS_AVG by Y, where Y is a positive real number greater than X, and the third reference value IREF3 may be obtained by multiplying the average initial standby current IRS_AVG by Z, where Z is a positive real number greater than Y.

In an exemplary embodiment, the first reference value IREF1 is about twice or exactly twice the average initial standby current IRS_AVG, the second reference value IREF2 is about three times or exactly three times the average initial standby current IRS_AVG, and the third reference value IREF3 is about four times or exactly four times the average initial standby current IRS_AVG. In other words, X=2, Y=3 and Z=4. However, exemplary embodiments of the inventive concept are not limited thereto, and each of X, Y and Z may be changed depending on product characteristics.

Although FIGS. 14 and 15 illustrate an example where the initial standby currents are measured for three different temperatures (e.g., three-point temperature management is performed), exemplary embodiments of the inventive concept are not limited thereto. For example, the initial standby currents may be measured and/or managed for a plurality of different temperatures of two temperatures or four or more temperatures.

FIG. 16 is a flowchart illustrating a method of operating a storage device according to an exemplary embodiment of the inventive concept. The descriptions repeated with FIGS. 1 and 13 will be omitted.

Referring to FIG. 16, in a method of operating a storage device according to an exemplary embodiment of the inventive concept, the at least one reference value is set based on an initial standby current measured in a process of manufacturing the storage device and an operating temperature of the storage device (step S500a). Step S500a in FIG. 16 may be similar to step S500 in FIG. 13, except that the operating temperature is further considered.

After the at least one reference value is set, the standby current is sensed (step S100). Next, the operating temperature is sensed (step S600). Next, it is determined, based on the sensed standby current, the sensed operating temperature and the at least one reference value, whether the product abnormality has occurred within the storage device (step S200a), and the step-wise control operation is performed for the storage device when the product abnormality is detected on the storage device (step S300). Steps S100 and S300 in FIG. 16 may be substantially the same as steps S100 and S300 in FIG. 1, respectively. Step S200a in FIG. 16 may be similar to step S200 in FIG. 1, except that the operating temperature is further considered.

Although FIG. 16 illustrates that step S600 is performed after step S100 is performed, exemplary embodiments of the inventive concept are not limited thereto. For example, steps S100 and S600 may be substantially simultaneously or concurrently performed.

FIG. 17 is a flowchart illustrating a method of setting at least one reference value in FIG. 16 according to an exemplary embodiment of the inventive concept. FIG. 18 is a diagram for describing an operation of setting at least one reference value in FIG. 17. The descriptions repeated with FIGS. 14 and 15 will be omitted.

Referring to FIGS. 16, 17 and 18, when setting the at least one reference value based on the initial standby current (step S500), the initial standby current may include two or more initial standby currents that are measured at different temperatures, and the at least one reference value may be set based on the two or more initial standby currents and the operating temperature. FIGS. 17 and 18 also illustrate an example where the at least one reference value includes the first, second and third reference values.

Step S510 in FIG. 17 may be substantially the same as step S510 in FIG. 14.

The first reference value IREF1, the second reference value IREF2 and the third reference value IREF3 are set to values suitable for the first temperature HT based on the first initial standby current IRS1 (step S540). For example, the first reference value IREF1 at a value suitable for the first temperature HT may be obtained by multiplying the first initial standby current IRS1 by X, the second reference value IREF2 at a value suitable for the first temperature HT may be obtained by multiplying the first initial standby current IRS1 by Y, and the third reference value IREF3 at a value suitable for the first temperature HT may be obtained by multiplying the first initial standby current IRS1 by Z.

Similarly, the first reference value IREF1, the second reference value IREF2 and the third reference value IREF3 at values suitable for the second temperature RT may be set based on the second initial standby current IRS2 (step S550), and the first reference value IREF1, the second reference value IREF2 and the third reference value IREF3 at values suitable for the third temperature CT may be set based on the third initial standby current IRS3 (step S560).

Figure 19:
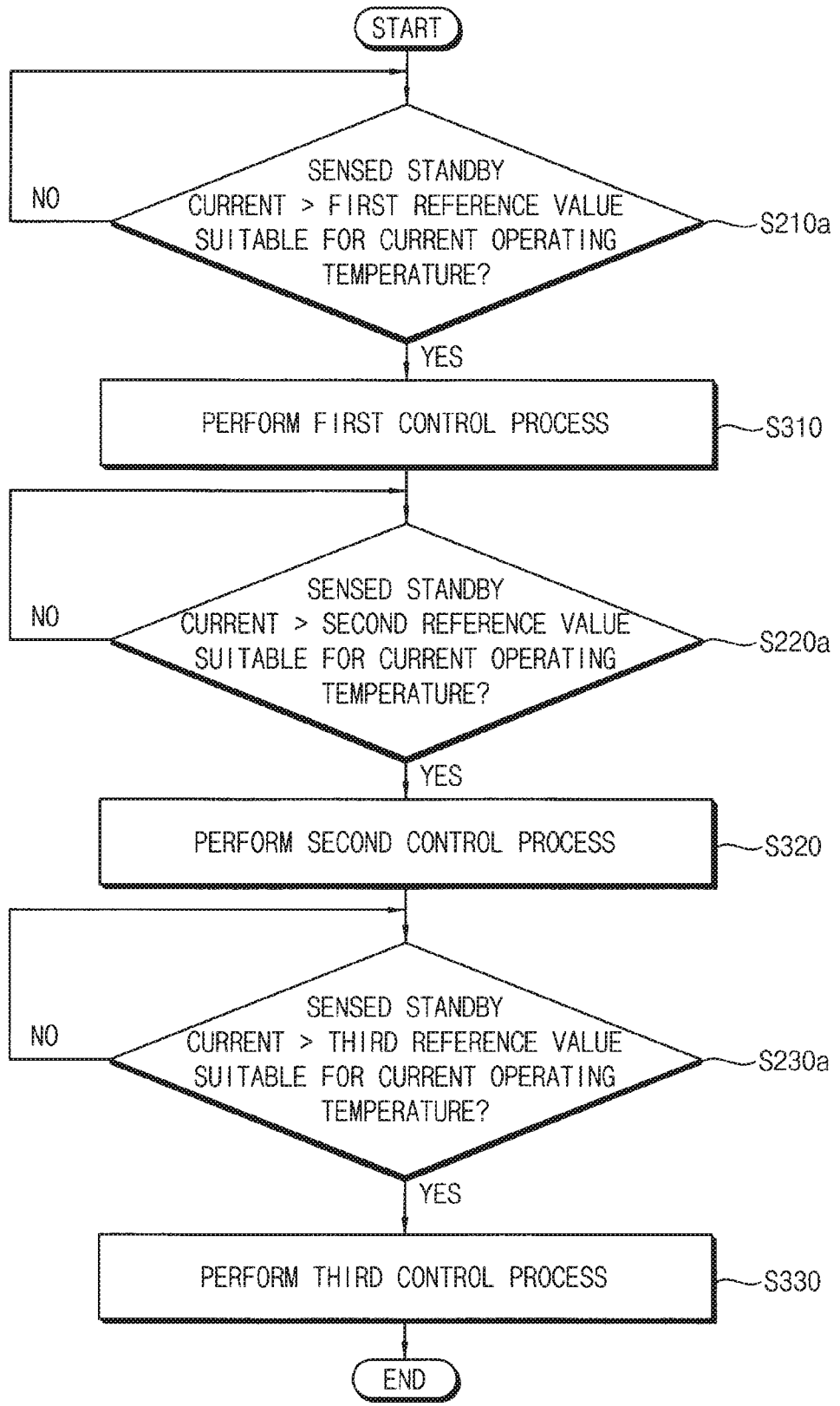
FIG. 19 is a flowchart illustrating a method of determining whether a product abnormality has occurred on a storage device and performing a step-wise control operation when the product abnormality is detected on the storage device in FIG. 16 according to an exemplary embodiment of the inventive concept.

FIG. 19 is a flowchart illustrating a method of determining whether a product abnormality has occurred within a storage device and performing a step-wise control operation when the product abnormality is detected within the storage device in FIG. 16 according to an exemplary embodiment of the inventive concept. The descriptions repeated with FIG. 8 will be omitted.

Referring to FIGS. 16, 18 and 19, steps S210a, S220a and S230a in FIG. 19 may be similar to steps S210, S220 and S230 in FIG. 8, respectively, except that the operating temperature is further considered. Steps S310, S320 and S330 in FIG. 19 may be substantially the same as steps S310, S320 and S330 in FIG. 8, respectively.

It is determined whether the sensed standby current exceeds the first reference value suitable for a current operating temperature (step S210a). For example, it may be determined whether the sensed standby current exceeds IRS1*X when the current operating temperature is the first temperature HT, it is determined whether the sensed standby current exceeds IRS2*X when the current operating temperature is the second temperature RT, and it is determined whether the sensed standby current exceeds IRS3*X when the current operating temperature is the third temperature CT.

Similarly, it is determined whether the sensed standby current exceeds the second reference value suitable for the current operating temperature (step S220a), and further it is determined whether the sensed standby current exceeds the third reference value suitable for the current operating temperature (step S230a).

Figure 20:
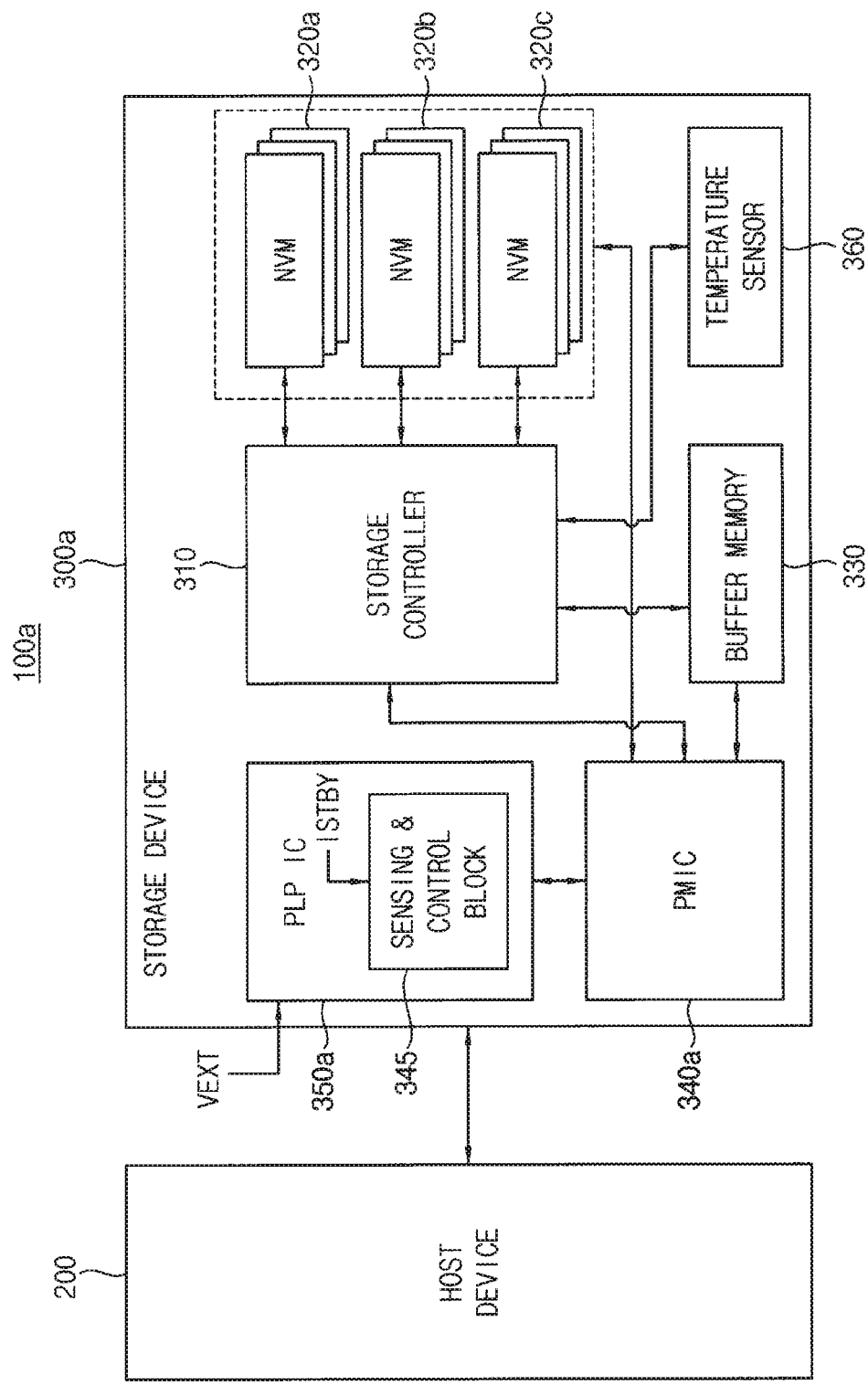
FIGS. 20 and 21 are block diagrams illustrating a storage device and a storage system including the storage device according to exemplary embodiments of the inventive concept.
Figure 21:
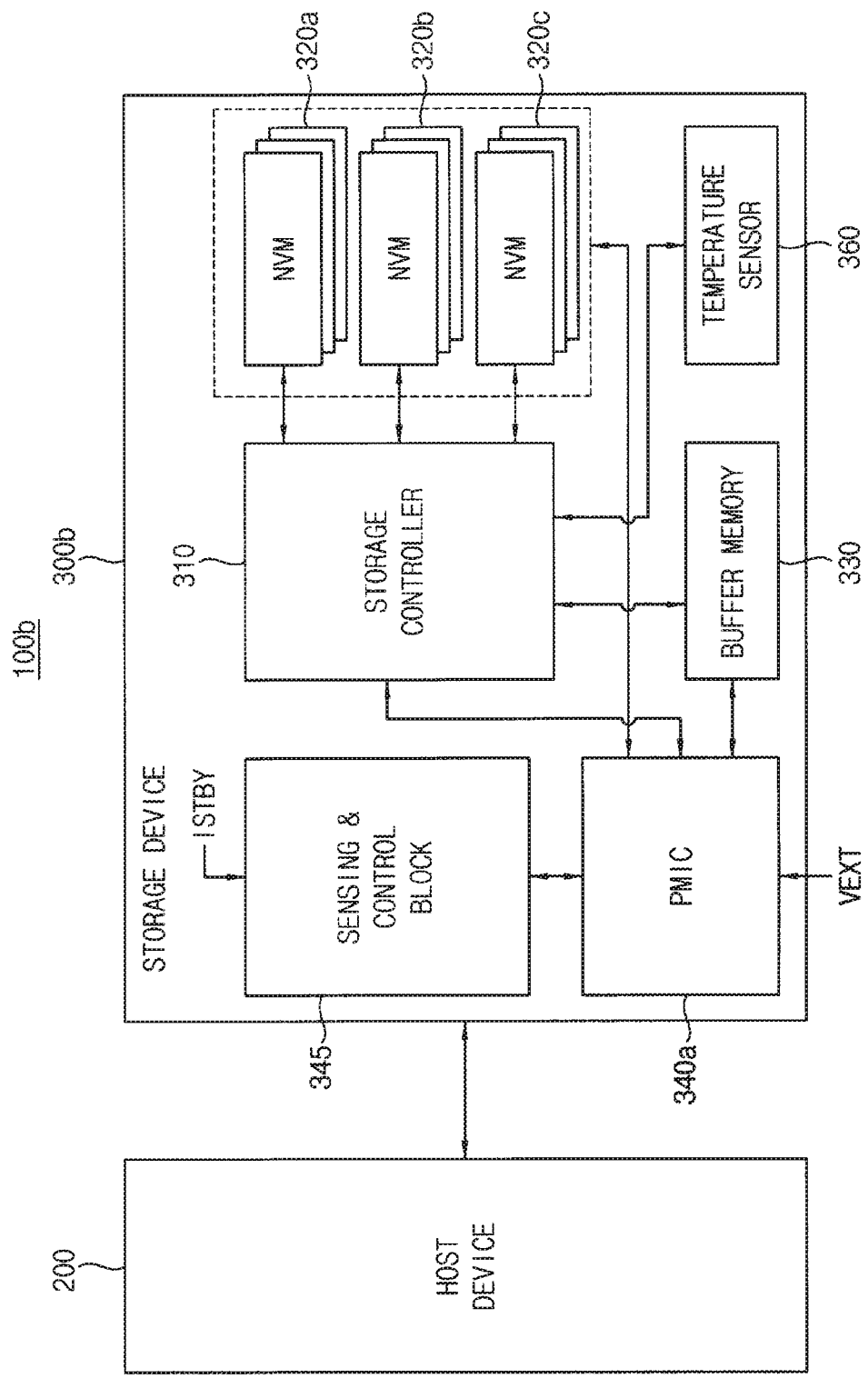

FIGS. 20 and 21 are block diagrams illustrating a storage device and a storage system including a storage device according to an exemplary embodiment of the inventive concept. The descriptions repeated with FIG. 2 will be omitted.

Referring to FIG. 20, a storage system 100a includes a host device 200 and a storage device 300a. The storage device 300a includes a storage controller 310, a plurality of nonvolatile memories 320a, 320b and 320c, a buffer memory 330, a PMIC 340a, a sensing and control block 345, a power-loss protection integrated circuit (PLP IC) 350a and a temperature sensor 360.

The storage system 100a and the storage device 300a of FIG. 20 may be substantially the same as the storage system 100 and the storage device 300 of FIG. 2, respectively, except that the storage device 300a further includes the PLP IC 350a and the sensing and control block 345 is included in the PLP IC 350a.

The PLP IC 350a may generate an internal power voltage based on the external power voltage VEXT. The PMIC 340a may generate and control the power signal (e.g., supply voltage) supplied to the storage controller 310, the plurality of nonvolatile memories 320a, 320b and 320c and the buffer memory 330 based on the internal power voltage.

In an exemplary embodiment, when the storage device 300a is suddenly powered off (e.g., in a case of sudden power-off), the PLP IC 350*a* generates an auxiliary power voltage for generating the power signal supplied to the storage controller 310, the plurality of nonvolatile memories 320*a*, 320*b* and 320*c* and the buffer memory 330. The PMIC 340*a* may supply the power signal for a predetermined time based on the auxiliary power voltage even after the storage device 300*a* is powered off. For example, the PLP IC 350*a* may include at least one capacitor or a battery for generating the auxiliary power voltage.

Referring to FIG. 21, a storage system 100*b* includes a host device 200 and a storage device 300*b*. The storage device 300*b* includes a storage controller 310, a plurality of nonvolatile memories 320*a*, 320*b* and 320*c*, a buffer memory 330, a PMIC 340*a*, a sensing and control block 345 and a temperature sensor 360.

The storage system 100*b* and the storage device 300*b* of FIG. 21 may be substantially the same as the storage system 100 and the storage device 300 of FIG. 2, respectively, except that the sensing and control block 345 is not included in the PMIC 340*a*.

Although not illustrated in FIGS. 20 and 21, an arrangement of the sensing and control block 345 may be changed in the storage device according to exemplary embodiments.

In a storage device and a method of operating the storage device according to at least one exemplary embodiment of the inventive concept, the standby current flowing through the storage device is sensed, and then the step-wise control operation for the storage device is performed when the product abnormality is detected according to the sensing result. By utilizing the standby current, it is possible to improve or enhance the overall product reliability of the storage device.

As will be appreciated by those of ordinary skill in the art, the inventive concept may be embodied as a system, method, computer program product, and/or a computer program product embodied in one or more computer readable medium(s) having computer readable program code embodied thereon. The computer readable program code may be provided to a processor of a general purpose computer, a special purpose computer, or other programmable data processing apparatus. The computer readable medium may be a computer readable signal medium or a computer readable storage medium. The computer readable storage medium may be any tangible medium that can contain or store a program for use by or in connection with an instruction execution system, apparatus, or device. For example, the computer readable medium may be a non-transitory computer readable medium.

Figure 22:
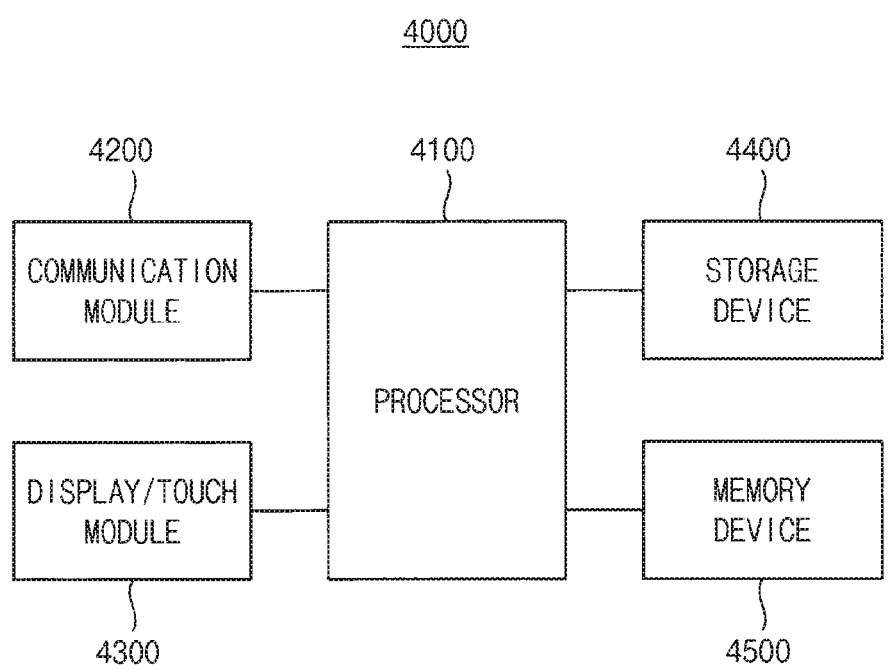
FIG. 22 is a block diagram illustrating an electronic system according to an exemplary embodiment of the inventive concept.

FIG. 22 is a block diagram illustrating an electronic system according to an exemplary embodiment of the inventive concept.

Referring to FIG. 22, an electronic system 4000 includes at least one processor 4100, a communication module 4200 (e.g. a modem, a network card, etc.), a display/touch module 4300 (e.g., a display device including a touch panel), a storage device 4400 and a memory device 4500. For example, the electronic system 4000 may be any mobile system or any computing system.

The processor 4100 controls operations of the electronic system 4000. The processor 4100 may execute an operating system and at least one application to provide an internet browser, games, or videos. The communication module 4200 performs wireless or wire communications with an external system. The display/touch module 4300 displays data processed by the processor 4100 and/or receives data through a touch panel. The storage device 4400 stores user data, and operates based on one or more of the above-described methods according to exemplary embodiments of the inventive concept. The memory device 4500 temporarily stores data used for processing operations of the electronic system 4000. The processor 4100 and the storage device 4400 may correspond to the host device 200 and the storage device 300 in FIG. 2, respectively.

Although not illustrated in FIG. 22, the electronic system may be implemented in the form of a storage server that includes a server, a plurality of storage devices which store data for operating the server, and a redundant array of independent drives (RAID) controller for controlling the plurality of storage devices.

Embodiments of the inventive concept may be applied to various electronic devices and/or systems including the storage devices and the storage systems. For example, embodiments of the inventive concept may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, or a drone.

The foregoing is illustrative of exemplary embodiments of the inventive concept and is not to be construed as limiting thereof. Although some exemplary embodiments have been described, those skilled in the art will readily appreciate that many modifications are possible in these exemplary embodiments without materially departing from the inventive concept. Accordingly, all such modifications are intended to be included within the scope of the exemplary embodiments.

What is claimed is:

1. A method of operating a storage device including a plurality of memory chips, the method comprising:
    sensing a standby current flowing through each of the memory chips of the storage device;
    for each sensed standby current,
        determining the corresponding memory chip to be a defective chip when the corresponding sensed current exceeds a first reference value,
        performing a first control process to identify a location of the defective chip among the plurality of memory chips when the corresponding memory chip is determined to be the defective chip; and
        performing a second control process sequential to the first control process for throttling the defective chip by reducing a number of transactions associated with the defective chip when the corresponding sensed current exceeds a second reference value higher than the first reference value,
    wherein the sensing includes turning on the plurality of memory chips one by one to sense a current flowing through each turned-on memory chip.

2. The method of claim 1, for each sensed standby current performing a third control process sequential to the second control process for terminating driving of the defective chip when the corresponding sensed standby current exceeds a third reference value that is greater than the second reference value.

3. The method of claim 2, further comprising:
setting the first reference value, the second reference value and the third reference value based on an initial standby current measured in a process of manufacturing the storage device.

4. The method of claim 3,
wherein: the initial standby current includes a first initial standby current that is measured at a first temperature, a second initial standby current that is measured at a second temperature different from the first temperature, and a third initial standby current that is measured at a third temperature different from the first temperature and the second temperature, and
setting the first reference value, the second reference value and the third reference value includes: setting the first reference value, the second reference value and the third reference value based on an average initial standby current obtained by averaging the first initial standby current, the second initial standby current and the third initial standby current.

5. The method of claim 3,
wherein: the initial standby current includes a first initial standby current that is measured at a first temperature, a second initial standby current that is measured at a second temperature different from the first temperature, and a third initial standby current that is measured at a third temperature different from the first temperature and the second temperature, and
setting the first reference value, the second reference value and the third reference value includes:
setting the first reference value, the second reference value and the third reference value to values suitable for the first temperature based on the first initial standby current;
setting the first reference value, the second reference value and the third reference value to values suitable for the second temperature based on the second initial standby current; and
setting the first reference value, the second reference value and the third reference value to values suitable for the third temperature based on the third initial standby current.

6. The method of claim 1, wherein performing the first control process further comprises:
performing an operation for notifying an external host device that a product abnormality has occurred within the storage device; and
performing an operation for logging that the product abnormality has occurred within the storage device.

7. The method of claim 6, wherein the operation of notifying the external host device that the product abnormality has occurred within the storage device is performed using an asynchronous event request (AER) command.

8. The method of claim 1, wherein the location of the defective chip is identified by sequentially turning on the plurality of chips one by one and by sensing a current flowing through each turned-on chip.

9. The method of claim 1, wherein:
the storage device includes a controller chip, the memory chips are nonvolatile memory chips, and the standby current represents a sum of a current flowing through the controller chip and currents flowing through the plurality of nonvolatile memory chips.

10. The method of claim 1, wherein an operation of sensing the standby currents is performed during an idle interval during which no input/output signal is exchanged between the storage device and an external host device while the storage device is driven.

11. The method of claim 10, wherein the operation of sensing the standby currents is periodically performed for each idle interval.

12. The method of claim 1, wherein an operation of sensing the standby currents is performed during a power on reset (POR) interval immediately after the storage device is powered on.

13. The method of claim 1, wherein the second control process is performed to reduce an operating voltage applied to the defective chip.

14. A storage device comprising:
a plurality of nonvolatile memory chips;
a storage controller configured to control an operation of the plurality of nonvolatile memory chips; and
a control circuit configured to sense a standby current of the storage device, to determine based on the sensed standby current and at least one reference value whether a product abnormality has occurred within the storage device when the sensed standby current exceeds a first reference value, to perform a first control process to identify a location of a defective nonvolatile memory among the nonvolatile memory chips when the product abnormality has occurred, and a second control process sequential to the first control process for throttling the defective nonvolatile memory by reducing a number of transactions associated with the defective nonvolatile memory when the sensed standby current exceeds a second reference value higher than the first reference value,
the standby current representing a sum of a current flowing through the storage controller and currents flowing through each of the plurality of nonvolatile memory chips.

15. The storage device of claim 14, further comprising:
a power management integrated circuit (PMIC) configured to generate and control a power signal supplied to the storage controller and the plurality of nonvolatile memory chips, and wherein the control circuit is located within the power management integrated circuit.

16. The storage device of claim 14, further comprising:
a power-loss protection integrated circuit (PLP IC) configured to generate an auxiliary power voltage for generating a power signal supplied to the storage controller and the plurality of nonvolatile memory chips when the storage device loses its main power supply, and wherein the control circuit is located within the power-loss protection integrated circuit.

17. The storage device of claim 14, wherein the reference values are set based on an initial standby current measured in a process of manufacturing the storage device.

18. The storage device of claim 17, wherein: the initial standby current includes two or more initial standby currents that are measured at different temperatures, and the at least one reference value is set based on an average initial standby current obtained by averaging the two or more initial standby currents.

19. The storage device of claim 17, further comprising:
a temperature sensor configured to sense an operating temperature of the storage device, wherein the initial standby current includes two or more initial standby currents that are measured at different temperatures, and wherein the at least one reference value is set based on the two or more initial standby currents and the sensed operating temperature.

20. A method of operating a storage system including a storage device and a host device external to the storage device, the method comprising:

sensing a standby current flowing through the storage device during an idle interval during which no input/output signal is exchanged between the storage device and the host device;

determining whether a product abnormality has occurred within the storage device based on the sensed standby current, a first reference value, a second reference value and a third reference value, wherein the first, second and third reference values are different from each other;

when it is determined that the product abnormality has occurred due to the sensed standby current exceeding the first reference value, performing a first control process that includes an operation of notifying the host device using an asynchronous event request (AER) command that the product abnormality has occurred, an operation of logging that the product abnormality has occurred, and an operation of identifying a location of a defective chip among a plurality of chips included in the storage device;

performing a second control process that includes an operation of controlling an operating voltage applied to the defective chip, and an operation of throttling the defective chip by reducing a number of transactions associated with the defective chip, when the sensed standby current exceeds the second reference value that is greater than the first reference value; and performing a third control process that includes an operation shutting down the defective chip to prevent its subsequent use, when the sensed standby current exceeds the third reference value that is greater than the second reference value.

* * * * *